United States Patent
Satoh et al.

[11] Patent Number: 5,847,489
[45] Date of Patent: Dec. 8, 1998

[54] PIEZOELECTRIC DEVICE AND A PACKAGE

[75] Inventors: Yuki Satoh, Neyagawa; Toshio Ishizaki, Kobe; Tsuyoshi Sakaue, Neyagawa; Koji Hashimoto, Kobe; Tohru Yamada, Katano; Tomoki Uwano, Hirakata, all of Japan

[73] Assignee: Matsushita Electric Industrial Co., Ltd., Osaka, Japan

[21] Appl. No.: 708,918

[22] Filed: Sep. 6, 1996

Related U.S. Application Data

[63] Continuation of Ser. No. 350,717, Dec. 7, 1994, which is a continuation of Ser. No. 186,566, Jan. 25, 1994, abandoned.

[30] Foreign Application Priority Data

| Jan. 25, 1993 | [JP] | Japan | 5-010125 |
| Mar. 30, 1993 | [JP] | Japan | 5-071440 |
| Apr. 16, 1993 | [JP] | Japan | 5-089610 |
| Apr. 16, 1993 | [JP] | Japan | 5-089611 |

[51] Int. Cl.$^6$ .................................................. H01L 41/08
[52] U.S. Cl. ........................................... 310/348; 310/346
[58] Field of Search ..................................... 310/348, 361, 310/365, 368, 321, 346, 367

[56] References Cited

U.S. PATENT DOCUMENTS

| 2,268,365 | 12/1941 | Willard | 310/361 |
| 2,907,680 | 10/1959 | Smith et al. | 117/71 |
| 3,397,278 | 8/1968 | Pomerantz | 174/52 |

(List continued on next page.)

FOREIGN PATENT DOCUMENTS

| 0 503 892 | 9/1992 | European Pat. Off. |  |
| 0 503 892 A1 | 9/1992 | European Pat. Off. | 310/346 |
| 0531985 | 3/1993 | European Pat. Off. | H03H 9/02 |

(List continued on next page.)

OTHER PUBLICATIONS

J.P. Castera, "State of the art in design and technology of MSW devices (invited)", *Journal of Applied Physics*, 55 (6), pp. 2506–2511 (1984).

K. Matsumoto et al., "Preparation of bi-substituted YIG garnets by sol-gel synthesis and their magnetic properties", *IEEE Translation Journal on Magnetics in Japan*, vol. 6, No. 1, pp. 15–22 (Jan. 1991).

(List continued on next page.)

*Primary Examiner*—Thomas M. Dougherty
*Attorney, Agent, or Firm*—Ratner & Prestia

[57] ABSTRACT

A piezoelectric device includes a piezoelectric plate provided with at least one electrode at almost a central portion of each face; a first plate made of an ionic material having a recessed portion to cover the at least one electrode at one face to face the piezoelectric plate; and a second plate made of an ionic material having a recessed portion to cover the at least one electrode at one face to face the piezoelectric plate. Each of the at least one electrode is packaged by direct bonding the piezoelectric plate with the first plate and the second plate so as to be sandwiched therebetween. A package includes a body member made of an ionic material provided with a recessed portion or an opening, having a flat face around the recessed portion or the opening; and a covering member made of an ionic material having a flat face to cover the body member. The flat face of the body member and the flat face of the covering member are cleaned and attached to each other so as to be direct bonded with each other using hydrogen bonds generated between the ionic materials, thereby packaging the recessed portion or the opening.

10 Claims, 20 Drawing Sheets

U.S. PATENT DOCUMENTS

| | | | |
|---|---|---|---|
| 4,009,516 | 3/1977 | Chiang et al. | 29/592 |
| 4,191,905 | 3/1980 | Yasuda et al. | 310/344 |
| 4,266,156 | 5/1981 | Kizaki | 310/344 |
| 4,270,105 | 5/1981 | Parker et al. | 333/155 |
| 4,293,986 | 10/1981 | Kobayashi et al. | 29/25.35 |
| 4,362,961 | 12/1982 | Gerber | 310/370 |
| 4,464,598 | 8/1984 | Besson et al. | 310/344 |
| 4,479,070 | 10/1984 | Frische et al. | 310/338 |
| 4,633,122 | 12/1986 | Radice | 310/339 |
| 4,639,631 | 1/1987 | Chasan et al. | 310/344 |
| 4,665,374 | 5/1987 | Fathimulla | 333/196 |
| 4,698,820 | 10/1987 | Brandle, Jr. et al. | 372/41 |
| 4,967,466 | 11/1990 | Takeya et al. | 29/603 |
| 4,983,251 | 1/1991 | Haisma et al. | 156/630 |
| 5,075,641 | 12/1991 | Weber et al. | 331/108 C |
| 5,166,646 | 11/1992 | Avanic et al. | 331/107 A |
| 5,302,879 | 4/1994 | Totty et al. | 310/361 |
| 5,304,887 | 4/1994 | Heinecke et al. | 310/361 |
| 5,319,324 | 6/1994 | Satoh et al. | 331/158 |
| 5,453,652 | 9/1995 | Eda et al. | 310/313 R |
| 5,483,115 | 1/1996 | Haisma et al. | 310/156 |
| 5,548,178 | 8/1996 | Eda et al. | 310/349 |
| 5,589,724 | 12/1996 | Satoh et al. | 310/348 |

FOREIGN PATENT DOCUMENTS

| | | | |
|---|---|---|---|
| 0 575 948 | 12/1993 | European Pat. Off. . | |
| 2 547 458 | 12/1984 | France | 310/346 |
| 2547458 | 12/1984 | France . | |
| 2701200 | 7/1977 | Germany . | |
| 3922671 | 1/1991 | Germany | H01L 21/70 |
| 4404931 | 8/1994 | Germany | H01L 21/58 |
| 54-51792 | 4/1979 | Japan | H03H 9/10 |
| 55-64414 | 5/1980 | Japan | H03H 9/10 |
| 56-131219 | 10/1981 | Japan . | |
| 59-67710 | 4/1984 | Japan . | |
| 62-27040 | 6/1987 | Japan . | |
| 63-285195 | 11/1988 | Japan . | |
| 1-211217 | 8/1989 | Japan | G11B 5/66 |
| 2-232606 | 9/1990 | Japan | G02B 6/12 |
| 3-178206 | 8/1991 | Japan | H03B 5/30 |
| 4-283957 | 10/1992 | Japan . | |
| 4-313211 | 11/1992 | Japan | H01L 21/02 |
| 0705642 | 12/1979 | U.S.S.R. . | |
| 2202989 | 10/1988 | United Kingdom . | |

OTHER PUBLICATIONS

M. Totoki et al., "Demonstration of direct bonding between InP and gadolinium gallium garnet ($Gd_3Ga_5O_{12}$) substrates". *Electronics Letters*, vol. 30, No. 18, pp. 1534–1536 (Sep. 1994).

J. Haisma et al., "Silicon–on–insulator wafer bonding–wafer thinning technological evaluations", *Japanese Journal of Applied Physics*, vol. 28, No. 8, pp. 1426–1443 (Aug. 1989).

M. Murakami et al., "Development of Compact Surface Mounting Tape Quartz Crystal Resonator Measuring 7.0X5.0X2.3$mm^3$", *Nikkei Electronics*, pp. 163–169, Jan. 7, 1991 (partial translation provided).

C. Kittel, "3 Crystal Binding", *Introduction to Solid State Physics*, fifth edition, pp. 92–97 (1976).

European Search Report for EP 94101046 dated Jan. 4, 1996.

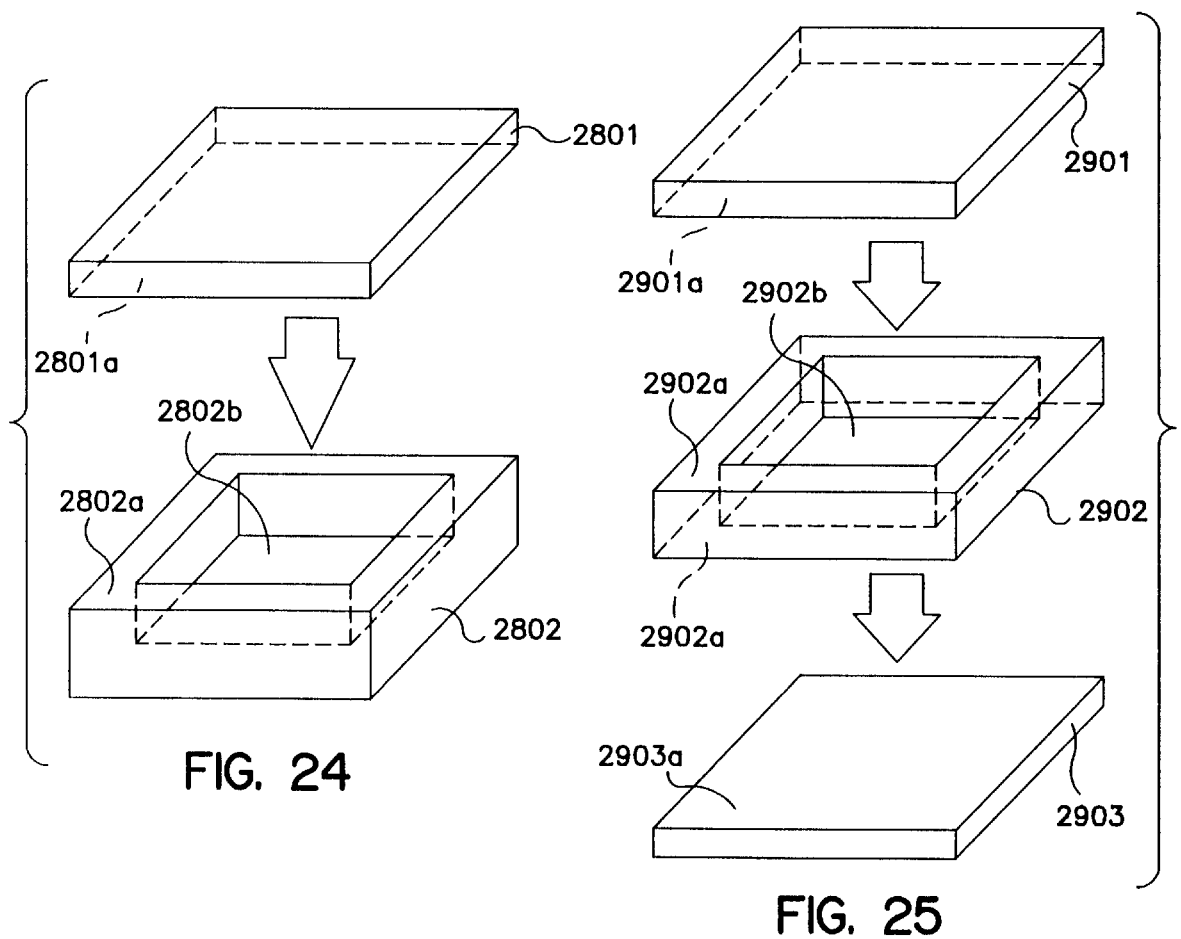
FIG. 24
FIG. 25
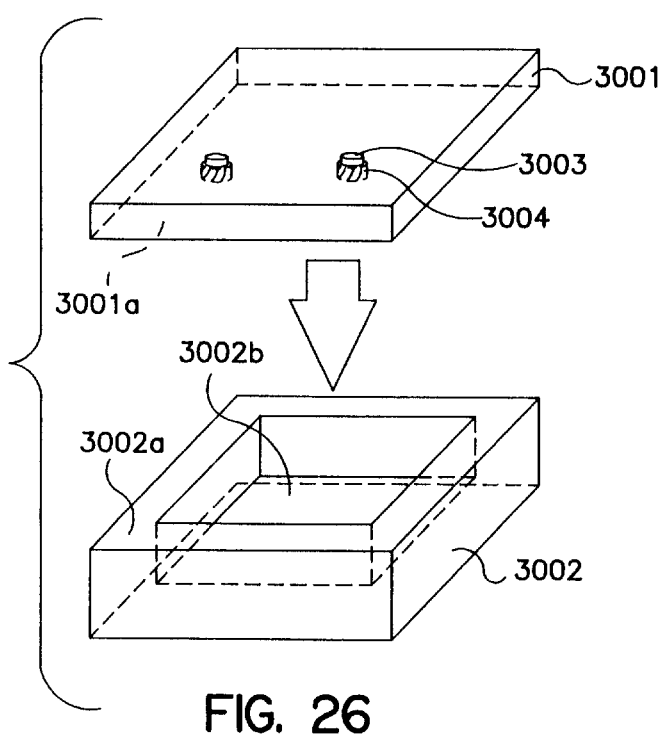
FIG. 26

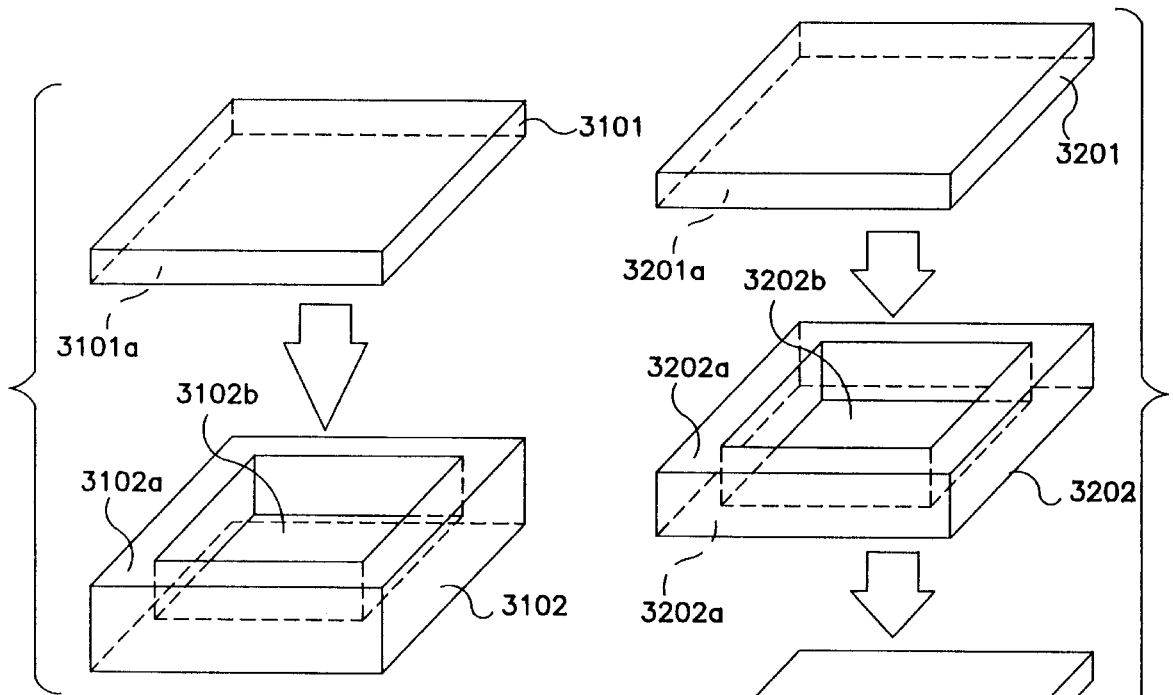
FIG. 27
FIG. 28
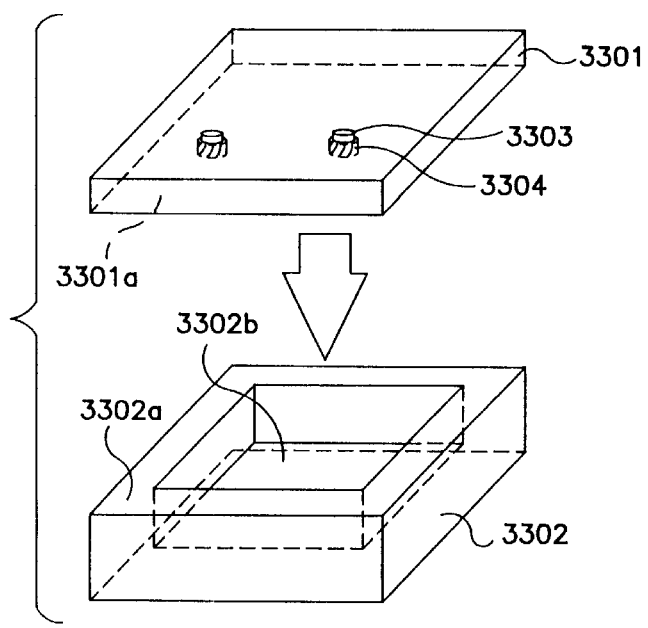
FIG. 29

PIEZOELECTRIC DEVICE AND A PACKAGE

This application is a continuation of application Ser. No. 08/350,717, filed Dec. 7, 1994, now allowed, which is a continuation of application Ser. No. 08/186,566, filed Jan. 25, 1994, now abandoned.

BACKGROUND OF THE INVENTION

1. Field of the Invention

The present invention relates to a package for hermetically packaging an electric device such as a resonator and a hybrid IC. More particularly, it relates to a package suitable for packaging a quartz device such as a quartz crystal resonator, a quartz filter, and a quartz surface acoustic wave filter used in circuits for mobile wireless communication equipment such as portable telephones.

2. Description of the Related Art

Recently, as mobile wireless communication equipment such as portable telephones have become widely used, there has been an increasing demand for a quartz device for a reference frequency source and a filter used in such equipment.

Hereinafter, a conventional ceramic package, a quartz crystal resonator, a quartz filter, and a quartz surface acoustic wave filter will be described referring to FIGS. 30 to 33.

FIG. 33 shows an exemplary structure for the conventional ceramic package. In FIG. 33, the conventional ceramic package includes a ceramic covering member 3701 and a ceramic body member 3702. On the top face of the ceramic body member 3702, a packaging glass 3702a is formed using a paste containing glass powders. A recessed portion 3702b is formed at the ceramic body member 3702.

As for the package shown in FIG. 33, a packaging operation is performed as follows: an object to be packaged is first put into the recessed portion 3702b, the ceramic covering member 3701 is overlaid thereon, and finally the container is wholly heated up to a temperature at which the glass 3702a melts. Such a packaging operation is described, for example, in Nikkei Electronics, Jan. 7, 1991 (No. 517), pp. 167.

FIG. 30 shows an exemplary structure for the conventional quartz crystal resonator. In FIG. 30, the conventional resonator includes a quartz plate 3401, an electrode 3402, conductive adhesives 3403 and 3404, supporting members 3405 and 3406, leading members 3407 and 3408, a supporting plate 3409, and a cap 3410. The electrode 3402 is formed on each face of the quartz plate 3401. The quartz plate 3401 functions as an electric resonator, whose resonance frequencies are determined by the thickness and the elastic constant thereof. The quartz plate 3401 is connected to the supporting members 3405 and 3406 both supported by the supporting plate 3409 by means of the conductive adhesives 3403 and 3404, and thus the quartz plate 3401 is electrically connected to the supporting members 3405 and 3406. In addition, the quartz plate 3401 is electrically connected to the outside via the leading members 3407 and 3408 via the supporting members 3405 and 3406. Furthermore, the cap 3410 packages the quartz plate 3401. The packaging operation is generally performed using a solder welding method.

FIG. 31a is a front view showing a structure for the conventional quartz filter, while FIG. 31b is a back view showing the structure for the conventional quartz filter. In FIGS. 31a and 31b, the conventional quartz filter includes a quartz plate 3501, electrodes 3502 to 3505, conductive adhesives 3506 to 3509, supporting members 3510 and 3511, leading members 3512 to 3515, a supporting plate 3516, and a covering member 3517. The electrodes 3502 and 3504 are disposed so as to be opposed to the electrodes 3503 and 3505, respectively.

The electrode 3502 is led to the outside by the leading member 3512 via the conductive adhesive 3506 and the supporting member 3510. The electrode 3504 is led to the outside by the leading member 3514 via the conductive adhesive 3508 and the supporting member 3511. Similarly, the electrode 3503 is led to the outside by the leading member 3513 via the conductive adhesive 3507. Likewise, the electrode 3505 is led to the outside by the leading member 3515 via the conductive adhesive 3509. The electrodes 3503 and 3505 are generally earthed.

Upon inputting an electrical signal to the electrode 3502, the quartz plate 3501 resonates at frequencies determined by the thickness and the elastic constant thereof. The thus caused resonance is mechanically propagated in the quartz plate 3501, so that an electrical field is generated between the two electrodes 3504 and 3505, and consequently the electrical signal can be picked up from the electrode 3504. That is, the quartz filter can function as a band-pass filter for the frequencies which are determined by the thickness and the elastic constant of the quartz plate 3501. In addition, the quartz plate 3401 is sealed by the supporting plate 3516 and the covering member 3517. Such a packaging operation is generally performed using the solder welding method.

FIG. 32 shows a structure for the conventional surface acoustic wave filter. In FIG. 32, the conventional surface acoustic wave filter includes a piezoelectric substrate 3601, a covering member 3602, a base member 3603, an interdigital transducer (IDT) type electrode 3604, a bonding pad 3605, and glass 3606. As shown in FIG. 32, the IDT type electrode 3604 is formed on the piezoelectric substrate 3601. Upon inputting an electrical signal to the electrode 3604, surface acoustic waves are excited on the piezoelectric substrate 3601, and finally only waves having certain frequencies can be propagated. Herein, an electrode pattern of the IDT type electrode 3604 and an effective piezoelectric constant of the piezoelectric substrate 3601 determine which surface acoustic waves can be propagated. According to such principles, a surface acoustic wave filter having the desired filter characteristics can be obtained by appropriately selecting the electrode pattern of the IDT type electrode 3604, and the material for and the cutting angle of the piezoelectric substrate 3601. The packaging is performed as follows: First, the piezoelectric substrate 3601 is fixed onto a recessed portion of the base member 3603 by using an adhesive. Thereafter, the glass 3606 is applied to the base member 3603, and the covering member 3602 is overlaid thereon. Finally, the container is wholly heated up to a temperature at which the glass 3606 melts, thereby integrating the covering member 3602 with the base member 3603.

The above-mentioned surface acoustic wave filter and package have some problems. For example, according to the conventional glass packaging method, a glass paste is used for packaging, so that gas is disadvantageously generated from the glass paste. As a result, the device characteristics are likely to deteriorate due to age. In addition, the use of glass as the adhesive necessitates the need for additional space for melted glass to flow for the packaging portion, which makes it difficult to miniaturize the device. Furthermore, such a complicated manufacturing process leads to a high production cost. Moreover, the solder welding method has a problem in that the height of the package is made higher as shown in FIGS. 30 and 31, which makes the face mounting of the package inappropriate.

In addition, not only for the structural reason, the above-mentioned quartz crystal resonator and quartz filter cannot be readily made compact because many components such as the supporting members, leading members, supporting plates, and covering members should be included therein. Moreover, the use of the conductive adhesive for the bonding of each component generates gas, and consequently the package is likely to deteriorate due to age.

SUMMARY OF THE INVENTION

According to one aspect of the invention, the piezoelectric device comprises: a piezoelectric plate provided with at least one electrode at almost a central portion of each face, a first plate made of an ionic material having a recessed portion to cover at least one electrode at one face to face the piezoelectric plate, and a second plate made of an ionic material having a recessed portion to cover at least one electrode at one face to face the piezoelectric plate, wherein at least one electrode is packaged by direct bonding the piezoelectric plate with the first plate and the second plate so as to be sandwiched therebetween.

In one embodiment, the piezoelectric plate, the first plate, and the second plate are all made of quartz.

In one embodiment, at least one electrode on one face of the piezoelectric plate is led to the other face of the piezoelectric plate via at least one through-hole filled with a conductive material.

According to another aspect of the invention, the piezoelectric device comprises: a piezoelectric plate provided with at least one electrode at almost a central portion corresponding to a thinner portion of each face, one face thereof having a recessed portion, the other face thereof being made flat, a first plate made of an ionic material having a recessed portion to cover at least one electrode at one face to face the flat face of the piezoelectric plate, and a second plate made of an ionic material having a flat face to face the face having the recessed portion of the piezoelectric plate, wherein at least one electrode is packaged by direct bonding the piezoelectric plate with the first plate and the second plate so as to be sandwiched therebetween.

According to another aspect of the invention, the piezoelectric device comprises: a piezoelectric plate provided with at least one electrode at almost a central portion corresponding to a thinner portion of each face having a recessed portion, a first plate made of an ionic material having a flat face to face the piezoelectric plate, and a second plate made of an ionic material having a flat face to face the piezoelectric plate, wherein at least one electrode is packaged by direct bonding the piezoelectric plate with the first plate and the second plate so as to be sandwiched therebetween.

According to another aspect of the invention, the surface acoustic wave filter comprises: a piezoelectric substrate provided with a plurality of electrodes at one face, and a covering member made of an ionic material having a recessed portion to cover the electrode at one face to face the piezoelectric substrate, wherein the plurality of electrodes are packaged by direct bonding the piezoelectric substrate with the covering member.

In one embodiment, the piezoelectric substrate is made of quartz, lithium niobate ($LiNbO_3$) or lithium tantalate ($LiTaO_3$).

In one embodiment, the piezoelectric substrate and the covering member are made of the same material.

In one embodiment, a stress buffering plate is attached to the face opposite the face of the piezoelectric substrate where the plurality of electrodes are formed.

In one embodiment, a plurality of through-holes filled with a conductive material are formed in the piezoelectric substrate so as to electrically connect the plurality of electrodes to the outside.

According to another aspect of the invention, the surface acoustic wave filter comprises: a piezoelectric substrate provided with a plurality of electrodes at one face, and a covering member having a recessed portion to cover the plurality of electrodes at one face to face the piezoelectric substrate and being covered with an ionic material at the face to be direct bonded with the piezoelectric substrate, wherein the plurality of electrodes are packaged by direct bonding the piezoelectric substrate with the covering member.

According to still another aspect of the invention, the package comprises: a body member made of an ionic material provided with a recessed portion or an opening, having a flat face around the recessed portion or the opening, and a covering member made of an ionic material having a flat face so as to cover the body member, wherein the flat face of the body member and the flat face of the covering member are cleaned and attached to each other so as to be direct bonded with each other using hydrogen bonds generated between the ionic materials, thereby packaging the recessed portion or the opening.

In one embodiment, a through-hole filled with a conductive material and a metal bump extending from the through-hole are provided in the body member or the covering member.

According to still another aspect of the invention, the package comprises: a body member provided with a recessed portion or an-opening, having a flat face around the recessed portion or the opening, the flat face being coated with an ionic material, and a covering member having a flat face to cover the body member, the flat face being coated with an ionic material, wherein the flat face of the body member and the flat face of the covering member are cleaned and attached to each other so as to be direct bonded with each other using hydrogen bond generated between the ionic materials, thereby packaging the recessed portion or the opening.

In one embodiment, the body member or the covering member is made of metal or ceramics.

Thus, the invention described herein makes possible the advantages of providing an economical, efficient, reliable and compact package for hermetically packaging an electric device such as a quartz crystal resonator, a quartz filter, a quartz surface acoustic wave filter, and a hybrid IC that will not deteriorate due to age.

These and other advantages of the present invention will become apparent to those skilled in the art upon reading and understanding the following detailed description with reference to the accompanying figures.

BRIEF DESCRIPTION OF THE DRAWINGS

FIG. 24 is a perspective view of a package according to Example 16 of the present invention.

FIG. 25 is a perspective view of a package according to Example 17 of the present invention.

FIG. 26 shows a structure for a package according to Example 18 of the present invention.

FIG. 27 shows a structure for a package according to Example 19 of the present invention.

FIG. 28 shows a structure for a package according to Example 20 of the present invention.

FIG. 29 shows a structure for a package according to Example 21 of the present invention.

FIG. 31a is a front view showing an exemplary structure for a conventional quartz filter.

FIG. 31b is a back view showing the exemplary structure for the conventional quartz filter.

DESCRIPTION OF THE PREFERRED EMBODIMENTS

EXAMPLE 1

Hereinafter, the present invention will be described referring to the preferred examples using a quartz as a piezoelectric material for resonators and an ionic material for package members in some examples. A quartz crystal resonator according to Example 1 of the present invention will be described referring to FIGS. 1 and 2.

Figure 1:
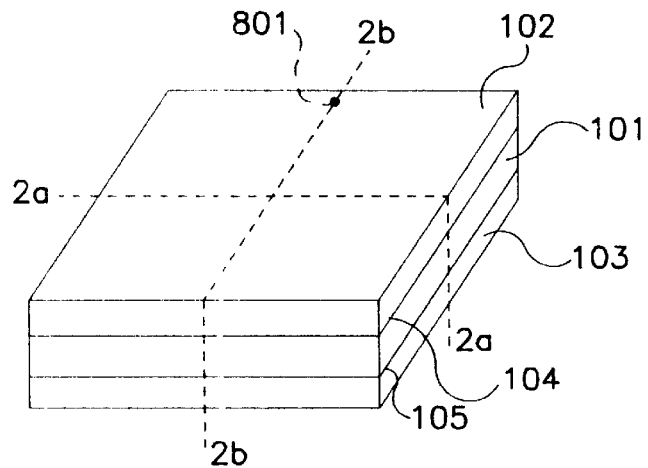
FIG. 1 is a perspective view of a quartz crystal resonator according to Examples 1 to 3 of the present invention.
Figure 2A:
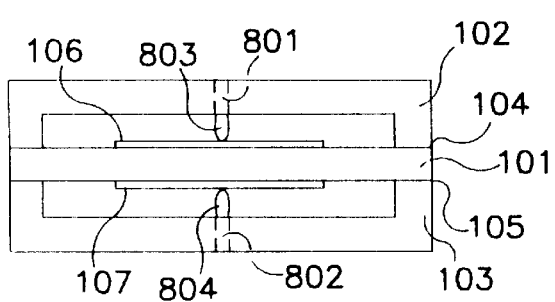
FIG. 2a is a cross-sectional view taken along the line 2a—2a of FIG. 1 according to Example 1.
Figure 2B:
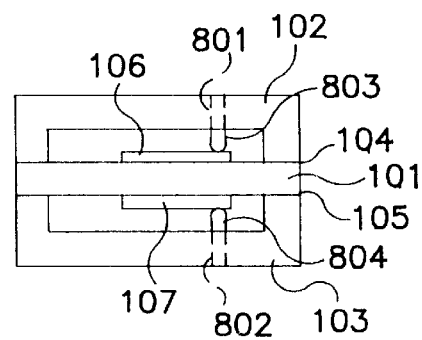
FIG. 2b is a cross-sectional view taken along the line 2b—2b of FIG. 1 according to Example 1.
Figure 2C:
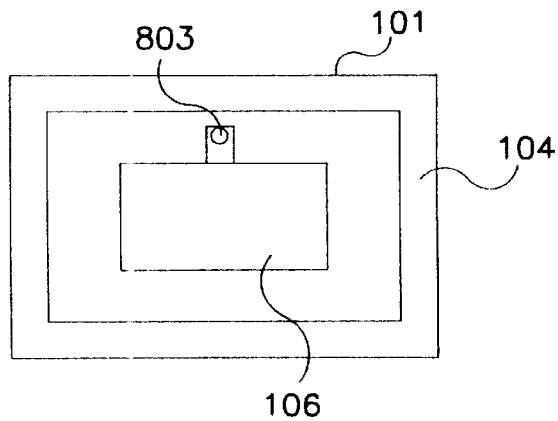
FIG. 2c is a plan view of a quartz plate according to Example 1.

FIG. 1 is a perspective view of the quartz crystal resonator according to Example 1. FIG. 2a is a cross-sectional view taken along the line 2a—2a of FIG. 1, and FIG. 2b is a cross-sectional view taken along the line 2b—2b of FIG. 1. FIG. 2c is a top plan view of a quartz plate of the quartz crystal resonator.

In FIG. 1, the quartz crystal resonator includes the quartz plate 101, a covering quartz plate 102, a base quartz plate 103, and a through-hole 801. The covering quartz plate 102 and the base quartz plate 103 are integrally and direct bonded with the quartz plate 101 at direct bonding faces 104 and 105, respectively, without using adhesives.

Figure 3:
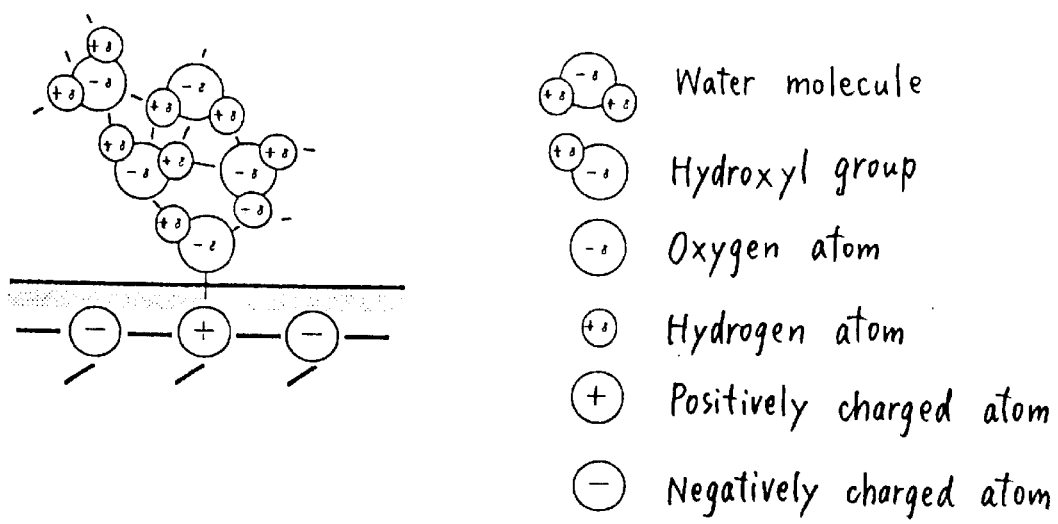
FIG. 3 is a scheme showing a cleaned face of an ionic material according to the present invention.

Herein, the direct bonding process will be described referring to FIG. 3. The direct bonding process is carried out after carefully and sufficiently cleaning the face of the ionic material. As shown in FIG. 3, a hydroxyl group (—OH) is formed on the face due to the presence of an electric charge of atoms. Furthermore, several layers of water molecules are formed around hydroxyl groups on the surface. When such two ionic materials each having a sufficiently flat face are attached to each other, they are firmly bonded together through direct bonding by the hydrogen bond formed among the hydroxyl groups and water molecules. Thus, the flat faces of the ionic materials can be direct bonded with each other without using adhesives. Herein, the direct bonding means the bonding utilizing adhesion generated between the ionic materials, which is achieved by cleaning the faces of the ionic materials such as quartz, aluminum oxide, and glass. Such bonding is called the direct bonding because no alien substances such as adhesives exist between the bonding faces. And a subsequent annealing makes the bonding more stronger. As for quartz, the annealing below 573° C. at 1 atmosphere is desirable because of the stability of crystal structure.

First, a structure for the quartz crystal resonator according to Example 1 will be described with reference to FIGS. 2a to 2c. The covering quartz plate 102 and the base quartz plate 103 each have a recessed portion at almost the central portion thereof. The electrodes 106 and 107 are disposed so as to be opposed to each other. Herein, the cutting angle and thickness of the quartz plate 101 and the shape, pattern, and thickness of the electrodes 106 and 107 are determined so as to obtain the desired resonance characteristics. In addition, through-holes 801 and 802 each filled with a conductive material such as metal, are formed in the covering quartz plate 102 and the base quartz plate 103. The electrode 106 is led to the outside via the bump 803 and the through hole 801. The electrode 107 is led to the outside via the bump 804 and the through-hole 802. The quartz plate 101 is integrally and direct bonded with the covering quartz plate 102 at the direct bonding face 104, and with the base quartz plate 103 at the direct bonding face 105.

Next, an operation for the quartz crystal resonator of Example 1 will be discussed.

Upon inputting an electrical signal to one of the electrodes 106 and 107, the quartz plate 101 resonates at frequencies determined by the thickness and the elastic constant thereof. That is, the quartz crystal resonator functions as an electrical resonator having resonant frequencies determined by the thickness and the elastic constant of the quartz plate 101.

As is described above, the quartz plate 101 having the electrodes 106 and 107 on each face thereof has desired resonance characteristics. Without using adhesives, that is, by direct bonding such a quartz plate with two quartz plates constituting the package, it is possible to reduce the deterioration due to age. In addition, according to Example 1, the quartz plates having the same thermal expansion coefficient are bonded together, so that a compact and simple quartz crystal resonator excellent in thermal stability can be obtained. Besides, the electrodes can be led to the outside of the package while retaining the perfect packaging structure of the package by providing the through-holes 801 and 802, and bumps 803 and 804.

Figure 34:
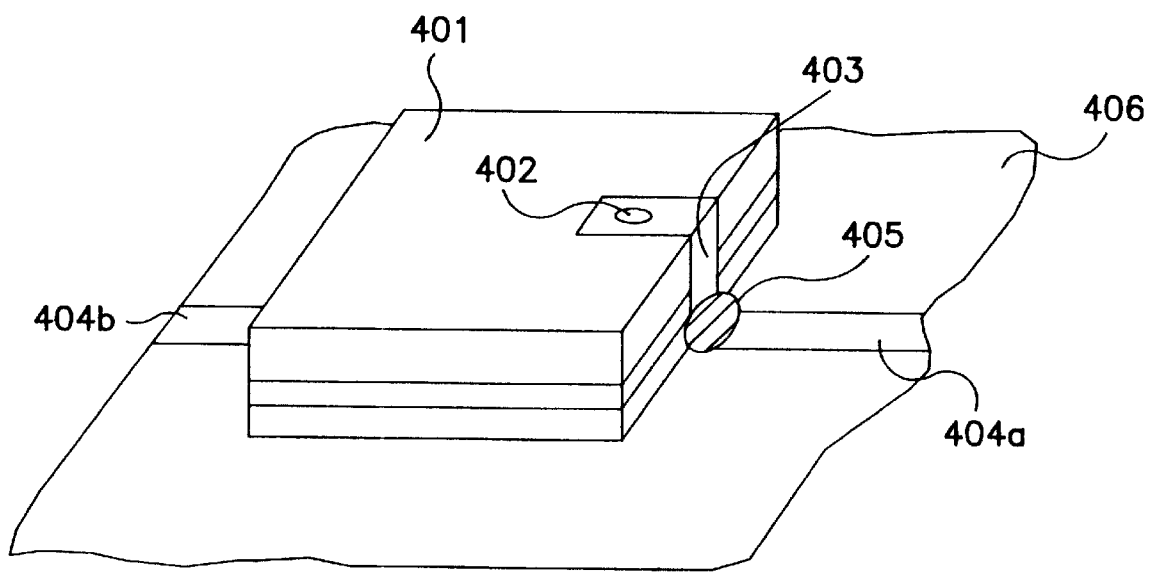
FIG. 34 is a perspective view showing another quartz crystal resonator according to Example 1 of the present invention mounted on a surface of a circuit board.

FIG. 34 shows another quartz crystal resonator 401 of the present example mounted on a surface of a circuit board 406. A wiring pattern 403 is formed on the surface of the quartz crystal resonator 401 so as to electrically be connected to a through-hole 402. A circuit pattern 404a is formed on the surface of the circuit board 406. The wiring pattern 403 is connected to the circuit pattern 404a by using solder. Another through-hole (not shown) is formed on the bottom surface of the quartz crystal resonator 401 in a portion close to a circuit pattern 404b and connected to the circuit pattern 404b by using solder.

EXAMPLE 2

Hereinafter, a quartz crystal resonator according to Example 2 of the present invention will be described with reference to FIGS. 1 and 4.

Figure 4A:
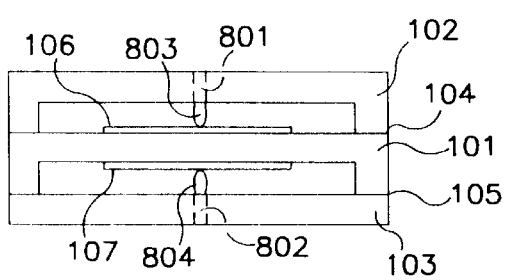
FIG. 4a is a cross-sectional view taken along the line 2a—2a of FIG. 1 according to Example 2.
Figure 4B:
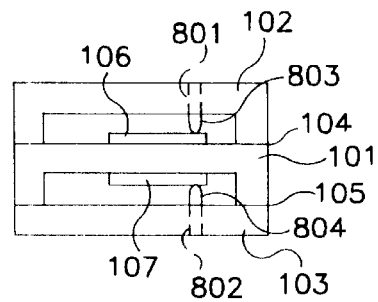
FIG. 4b is a cross-sectional view taken along the line 2b—2b of FIG. 1 according to Example 2.
Figure 4C:
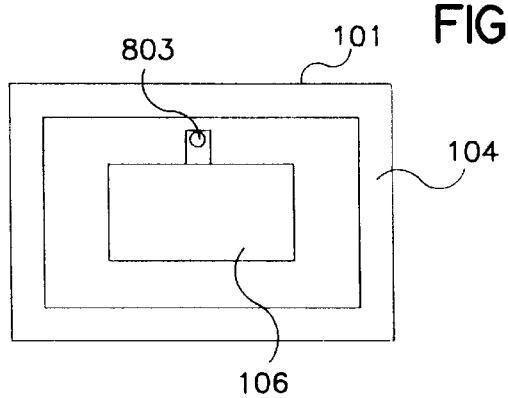
FIG. 4c is a plan view of a quartz plate according to Example 2.

FIG. 1 is a perspective view of the quartz crystal resonator according to Example 2. FIG. 4a is a cross-sectional view taken along the line 2a—2a of FIG. 1, and FIG. 4b is a cross-sectional view taken along the line 2b—2b of FIG. 1. FIG. 4c is a top plan view of the quartz crystal resonator.

As shown in FIG. 4, the quartz crystal resonator of Example 2 has the same structure as that of Example 1 excepting that the quartz plate 101 has a recessed portion at one face thereof, and the base quartz plate 103 is made flat without having a recessed portion.

An operation for the quartz crystal resonator of Example 2 is the same as that of Example 1, so that the description thereof will be omitted.

EXAMPLE 3

Hereinafter, a quartz crystal resonator according to Example 3 of the present invention will be described with reference to FIGS. 1 and 5.

Figure 5A:
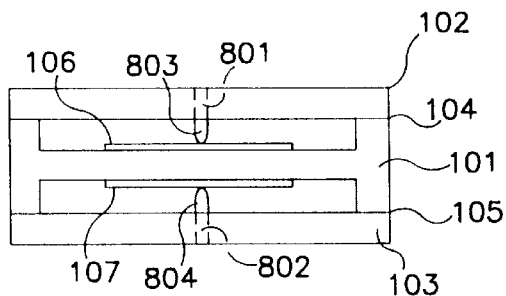
FIG. 5a is a cross-sectional view taken along the line 2a—2a of FIG. 1 according to Example 3.
Figure 5B:
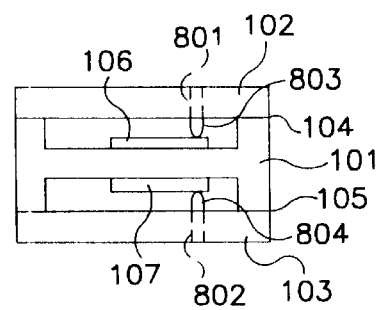
FIG. 5b is a cross-sectional view taken along the line 2b—2b of FIG. 1 according to Example 3.
Figure 5C:
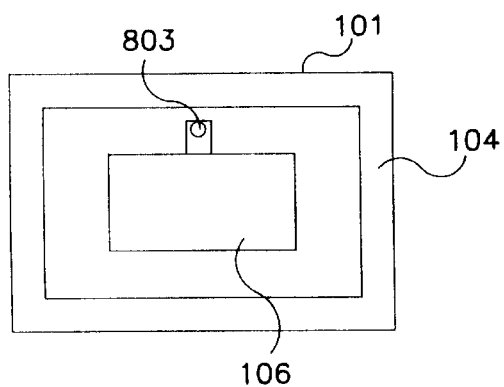
FIG. 5c is a plan view of a quartz plate according to Example 3.

FIG. 1 is a perspective view of the quartz crystal resonator according to Example 3. FIG. 5a is a cross-sectional view taken along the line 2a—2a of FIG. 1, and FIG. 5b is a cross-sectional view taken along the line 2b—2b of FIG. 1. FIG. 5c is a top plan view of the quartz crystal resonator.

As shown in FIG. 5, the quartz crystal resonator of Example 3 has the same structure as that of Example 1 excepting that the quartz plate 101 has a recessed portion at each face thereof, and the covering quartz plate 102 and the base quartz plate 103 are both made flat without having a recessed portion.

An operation for the quartz crystal resonator of Example 3 is the same as that of Example 1, so that the description thereof will be omitted.

EXAMPLE 4

Hereinafter, a quartz crystal resonator according to Example 4 of the present invention will be described with reference to FIGS. 6 and 7.

Figure 6:
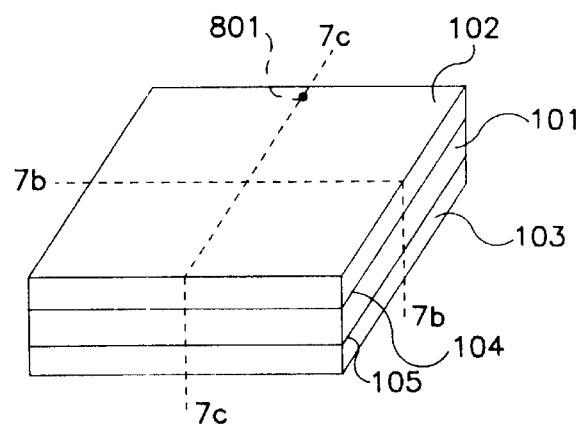
FIG. 6 is a perspective view of a quartz crystal resonator according to Example 4 of the present invention.
Figure 7A:
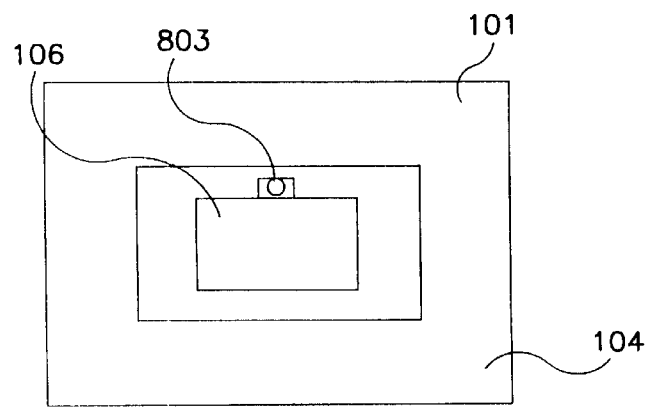
FIG. 7a is a plan view of a quartz plate according to Example 4.
Figure 7B:
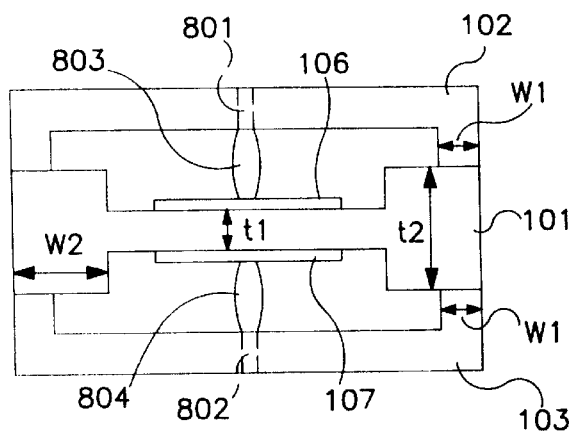
FIG. 7b is a cross-sectional view taken along the line 7b—7b of FIG. 6 according to Example 4.
Figure 7C:
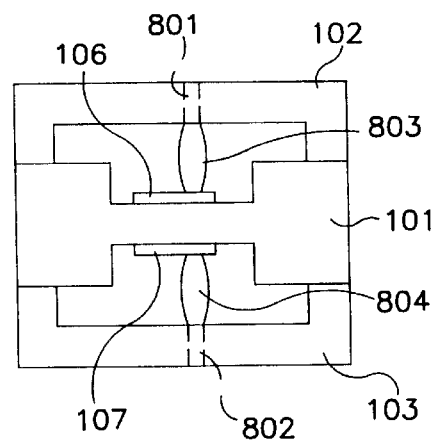
FIG. 7c is a cross-sectional view taken along the line 7c—7c of FIG. 6 according to Example 4.

FIG. 6 is a perspective view of the quartz crystal resonator according to Example 4. FIG. 7a is a top plan view of the quartz crystal resonator. FIG. 7b is a cross-sectional view taken along the line 7b—7b of FIG. 6, and FIG. 7c is a cross-sectional view taken along the line 7c—7c of FIG. 6.

As shown in FIG. 7, the quartz crystal resonator of Example 4 has the same structure as that of Example 1 excepting that the central portion of the quartz piece 101 is made thinner than the periphery thereof.

An operation for the quartz crystal resonator of Example 4 is the same as that of Example 1, so that the description thereof will be omitted.

As is described above, the quartz plate 101 having the electrodes 106 and 107 on each face thereof has desired resonance characteristics. By direct bonding such a quartz plate with two quartz plates constituting the package without using adhesives, it is possible to reduce the deterioration due to age. In addition, the quartz plates having the same thermal expansion coefficient are bonded together, so that a compact and simple quartz crystal resonator excellent in thermal stability can be obtained. In addition, the thickness of the area of the quartz plate 101 where the electrodes 106 and 107 are formed is made thinner than that of the areas where the quartz plate 101 is supported by the covering quartz plate 102 and the base quartz plate 103, so that elastic vibrational energy at the quartz plate 101 can be trapped within the area where electrodes 106 and 107 are formed, thereby realizing a quartz crystal resonator having a high Q value. In order to obtain a high Q value, the thickness of periphery portion of the quartz plate 101 (t2) should be (2n+1)/2 times as thick as that of the central portion of the quartz plate 101 (t1), where n is a positive integer such as 1, 2, 3 . . . The width of the periphery portion of the quartz plate 101 (w2) is wider than that of the quartz plates 102 and 103 (w1). More preferably, the width w2 is wider than the width w1 by about 100 μm or more. According to the above-mentioned structure, a deterioration of Q value and a change of resonance frequencies are both suppressed. In the present example, the thicknesses of the central portion and periphery portion of the quartz plate 101 are 130 μm and 195 μm, respectively, and the resonance frequency is 12.8 MHz.

EXAMPLE 5

Hereinafter, a quartz crystal resonator according to Example 5 of the present invention will be described with reference to FIGS. 8 and 9.

Figure 8:
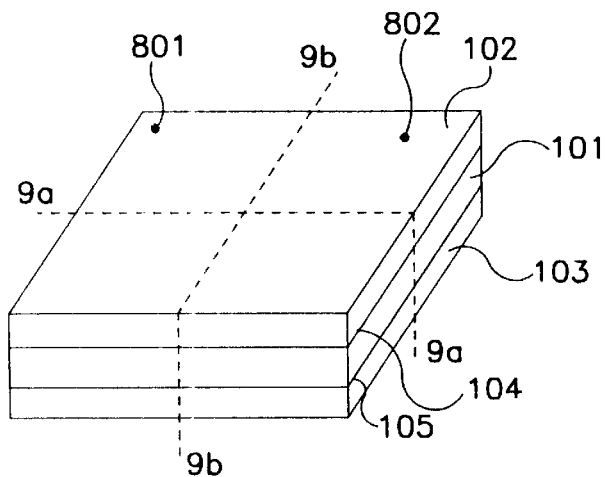
FIG. 8 is a perspective view of a quartz crystal resonator according to Example 5 of the present invention.
Figure 9A:
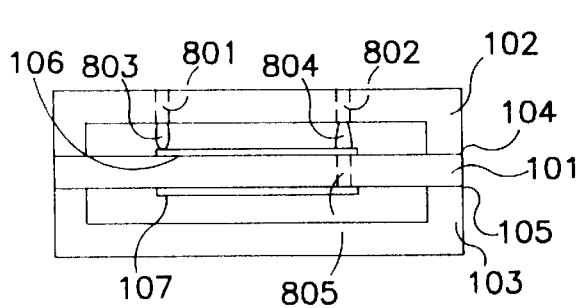
FIG. 9a is a cross-sectional view taken along the line 9a—9a of FIG. 8 according to Example 5.
Figure 9B:
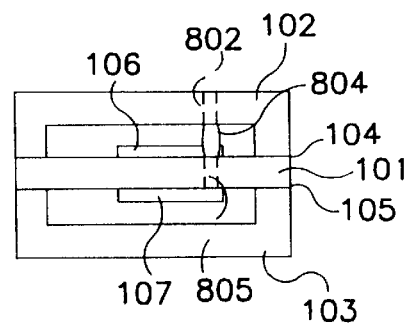
FIG. 9b is a cross-sectional view taken along the line 9b—9b of FIG. 8 according to Example 5.
Figure 9C:
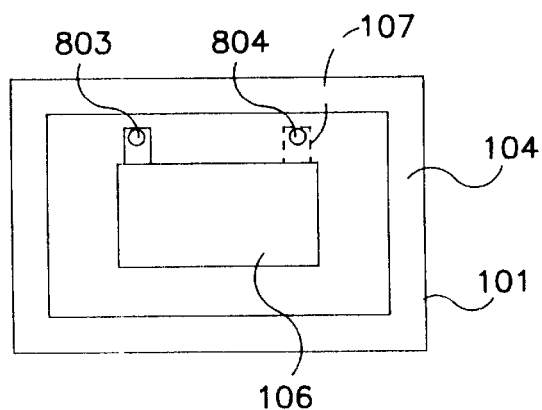
FIG. 9c is a plan view of a quartz plate according to Example 5.

FIG. 8 is a perspective view of the quartz crystal resonator according to Example 5. FIG. 9a is a cross-sectional view taken along the line 9a—9a of FIG. 8, and FIG. 9b is a cross-sectional view taken along the line 9b—9b of FIG. 8. FIG. 9c is a plan view of the quartz plate 101.

In FIG. 8, the quartz crystal resonator includes a quartz plate 101, a covering quartz plate 102, and a base quartz plate 103. The covering quartz plate 102 and the base quartz plate 103 are integrally and direct bonded with the quartz plate 101 at direct bonding faces 104 and 105, respectively, without using adhesives. Furthermore, through-holes 801 and 802 are formed in the covering quartz plate 102 and are filled with a conductive material. As shown in FIGS. 9a and 9b, electrodes 106 and 107 on the quartz plate 101. The reference numerals 803 and 804 indicate bumps. The quartz crystal resonator of Example 5 has the same structure as that of Example 1 excepting that a through-hole 805 filled with a conductive material is formed in the quartz plate 101. Herein, the cutting angle and thickness of the quartz plate 101 and the thickness and patterned shape of the electrodes 106 and 107 are determined so as to obtain desired resonance characteristics. In addition, the electrode 106 is electrically connected to the through-holes 801 and 802 via the bumps 803 and 804, while the electrode 107 and the through-hole 805 are electrically connected to the through-hole 802 via the bump 804.

An operation for the quartz crystal resonator of Example 5 is the same as that of Example 1, so that the description thereof will be omitted.

As is described above, the quartz plate 101 having the electrodes 106 and 107 on each face thereof has desired resonance characteristics. By direct bonding such a quartz plate with two quartz plates constituting the package without using adhesives, it is possible to reduce the deterioration due to age. In addition, according to Example 5, the quartz plates having the same thermal expansion coefficient are bonded together, so that a compact and simple quartz crystal resonator excellent in thermal stability can be obtained. In addition, the electrodes can be led to the outside of the package while the structure of the package remains perfect. In addition, by providing the through-hole 805 in the quartz plate 101, external input/output terminals (herein, through-holes 801 and 802) can be collected on one face of the package, which makes it easier to mount the quartz crystal resonator on a circuit board.

In Examples 1 to 5, each recessed portion of the quartz plate, the covering quartz plate, and the base quartz plate is formed by means of an ion-milling method by collision and sputtering of, say, inert gas ions such as $Ar^+$, a sandblasting method by collision and sputtering of sand particles under the presence of air, or an etching method by chemical reaction with, say, hydrofluoric acid.

In Examples 1 to 5, the ionic material for the covering member, the base member and the body member are not limited to quartz, but other ionic materials, for example fluorides such as LiF, NaF, and KF, oxides such as $Al_2O_3$, MgO, $TiO_2$, and $SiO_2$, chlorides such as LiCl, KCl, NaCl, and $CdCl_2$, intermediate compounds such as $MgAl_2O_4$, solid solution, and amorphous materials such as glass can also be employed in the present invention. Furthermore, the ionic materials to be used in the present invention may be single-crystalline or polycrystalline materials.

In the case where an amorphous material such as glass, or a polycrystalline material is used, the thermal expansion coefficient thereof does not show anisotropy but isotropy, generally. Therefore, the body member and the package member are not necessarily aligned in a specified crystal axis direction so as to avoid thermal stress.

In Examples 1 to 5, each shape of every component constituting the package is not particularly limited. For example, each shape of the recessed portions and the through-holes is not limited to the above-mentioned shape, but it may be a circle, a triangle, or any other desired shape.

In Examples 1 to 5, the material, thickness, and the patterned shape of the electrodes are not limited to the above as long as the desired resonance characteristics can be obtained.

EXAMPLE 6

Hereinafter, a quartz filter according to Example 6 of the present invention will be described with reference to FIGS. 10 and 11.

Figure 10:
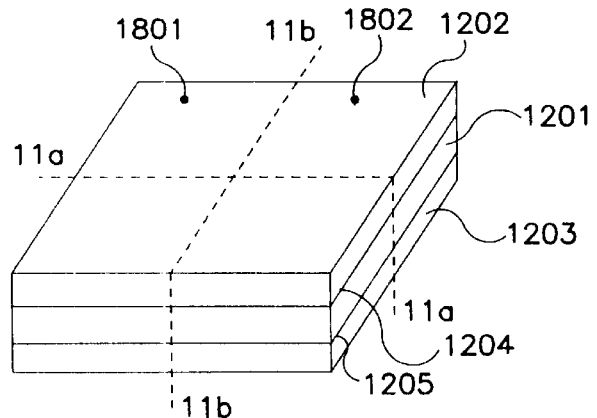
FIG. 10 is a perspective view of a quartz filter according to Examples 6 to 8 of the present invention.
Figure 11A:
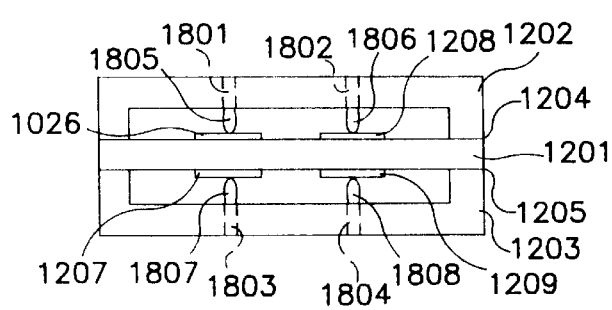
FIG. 11a is a cross-sectional view taken along the line 11a—11a of FIG. 10 according to Example 6.
Figure 11B:
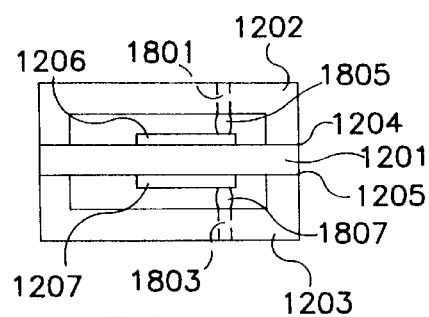
FIG. 11b is a cross-sectional view taken along the line 11b—11b of FIG. 10 according to Example 6.
Figure 11C:
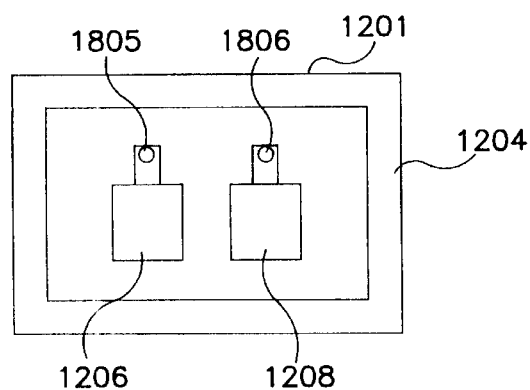
FIG. 11c is a plan view of a quartz plate according to Example 6.

FIG. 10 is a perspective view of the quartz filter according to Example 6. FIG. 11a is a cross-sectional view taken along the line 11a—11a of FIG. 10, and FIG. 11b is a cross-sectional view taken along the line 11b—11b of FIG. 10. FIG. 11c is a top plan view of the quartz filter.

In FIG. 10, the quartz filter includes a quartz plate 1201, a covering quartz plate 1202, a base quartz plate 1203, and through-holes 1801 and 1802. The covering quartz plate 1202 and the base quartz plate 1203 are integrally and direct bonded with the quartz plate 1201 at direct bonding faces 1204 and 1205, respectively, without using adhesives.

First, a structure for the quartz filter according to Example 6 will be described with reference to FIGS. 11a to 11c. The covering quartz plate 1202 and the base quartz plate 1203 each have a recessed portion at almost the central portion thereof. Electrodes 1206 and 1207 are disposed so as to be opposed to each other. Electrodes 1208 and 1209 are likewise disposed so as to be opposed to each other. Herein, the cutting angle and thickness of the quartz plate 1201 and the shape, pattern, and thickness of the electrodes 1206 to 1209 are determined so as to obtain the desired resonance characteristics. The quartz plate 1201 is direct bonded with the covering quartz plate 1202 at the direct bonding face 1204, and with the base quartz plate 1203 at the direct bonding face 1205. In addition, the through-holes 1801 to 1804, each filled with a conductive material such as metal, are formed in the covering quartz plate 1202 and the base quartz plate 1203. The electrodes 1206 to 1209 are led to the outside via the bumps 1805 to 1808 and the thorough holes 1801 to 1804, respectively.

Next, an operation for the quartz filter of Example 6 will be discussed.

Generally, one of the electrodes 1206 and 1207, and one of the electrodes 1208 and 1209 are earthed. When assuming that the electrodes 1207 and 1209 are earthed, and the electrodes 1206 and 1208 are used as an input terminal and an output terminal, respectively, the quartz plate 1201 resonates at the frequencies determined by the thickness and the elastic constant thereof, upon inputting an electrical signal to the electrode 1206. This resonance is mechanically propagated in the quartz plate 1201, so that an electrical field is generated between the electrodes 1208 and 1209, and consequently the electrical signal can be picked up from the electrode 1208. That is, the quartz filter can function as a band-pass filter for the frequencies which are determined by the thickness and the elastic constant of the quartz plate 1201.

As is described above, the quartz plate 1201 having the electrodes 1206 and 1207 on each face thereof has the desired resonance characteristics. By direct bonding such a quartz plate with two quartz plates constituting the package without using adhesives, it is possible to reduce the deterioration due to age. In addition, according to Example 6, the quartz plates having the same thermal expansion coefficient are bonded together, so that a compact and simple quartz filter that is excellent in thermal stability can be obtained. Besides, the electrodes can be readily led to the outside of the package while the structure of the package remains perfect by providing the through-holes 1801 to 1804, and bumps 1805 to 1808.

EXAMPLE 7

Hereinafter, a quartz filter according to Example 7 of the present invention will be described with reference to FIGS. 10 and 12.

Figure 12A:
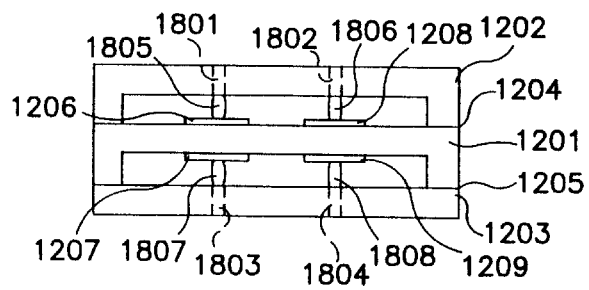
FIG. 12a is a cross-sectional view taken along the line 11a—11a of FIG. 10 according to Example 7.
Figure 12B:
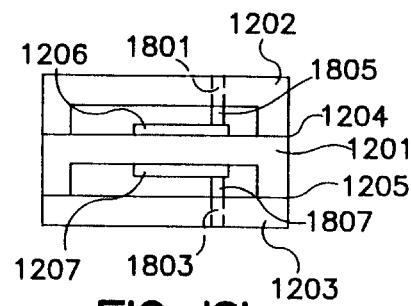
FIG. 12b is a cross-sectional view taken along the line 11b—11b of FIG. 10 according to Example 7.
Figure 12C:
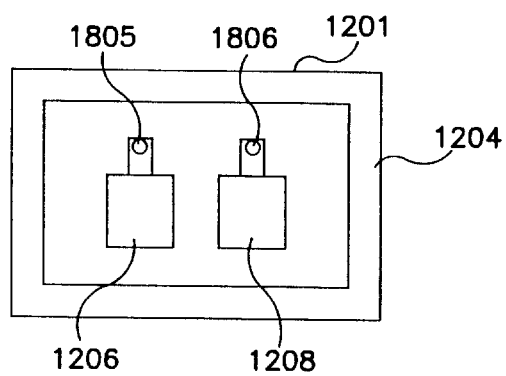
FIG. 12c is a plan view of a quartz plate according to Example 7.

FIG. 10 is a perspective view of the quartz filter according to Example 7. FIG. 12a is a cross-sectional view taken along the line 11a—11a of FIG. 10, and FIG. 12b is a cross-sectional view taken along the line 11b—11b of FIG. 10. FIG. 12c is a top plan view of the quartz plate.

As shown in FIGS. 12a to 12c, the quartz filter of Example 7 has the same structure as that of Example 6 excepting that the quartz plate 1201 has a recessed portion at one face thereof, and the base quartz plate 1203 is made flat without having a recessed portion.

An operation for the quartz filter of Example 7 is the same as that of Example 6, so that the description thereof will be omitted.

EXAMPLE 8

Hereinafter, a quartz filter according to Example 8 of the present invention will be described with reference to FIGS. 10 and 13.

Figure 13A:
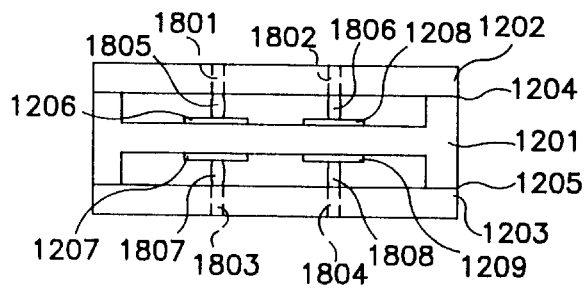
FIG. 13a is a cross-sectional view taken along the line 11a—11a of FIG. 10 according to Example 8.
Figure 13B:
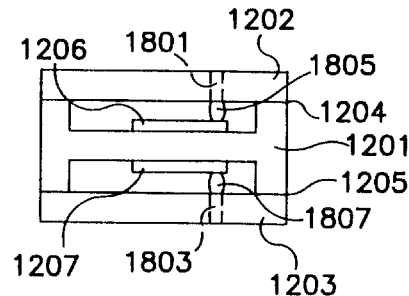
FIG. 13b is a cross-sectional view taken along the line 11b—11b of FIG. 10 according to Example 8.
Figure 13C:
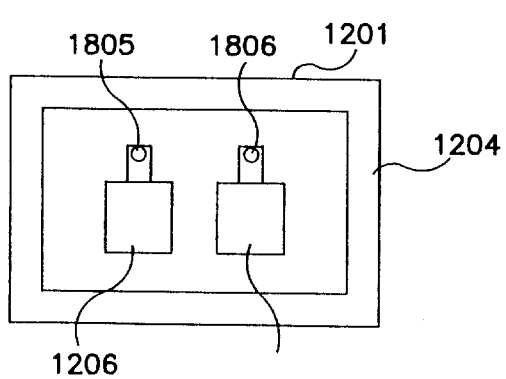
FIG. 13c is a plan view of a quartz plate according to Example 8.

FIG. 10 is a perspective view of the quartz filter according to Example 8. FIG. 13a is a cross-sectional view taken along the line 11a—11a of FIG. 10, and FIG. 13b is a cross-sectional view taken along the line 11b—11b of FIG. 10. FIG. 13c is a top plan view of the quartz plate.

As shown in FIGS. 13a to 13c, the quartz filter of Example 8 has the same structure as that of Example 6 excepting that the quartz plate 1201 has a recessed portion at each face thereof, and the covering quartz plate 1202 and the base quartz plate 1203 are both made flat without having a recessed portion.

An operation for the quartz filter of Example 8 is the same as that of Example 6, so that the description thereof will be omitted.

EXAMPLE 9

Hereinafter, a quartz filter according to Example 9 of the present invention will be described with reference to FIGS. 14 and 15.

Figure 14:
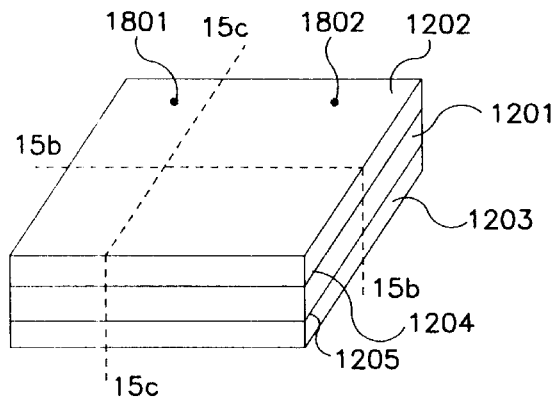
FIG. 14 is a perspective view of a quartz filter according to Example 9 of the present invention.
Figure 15A:
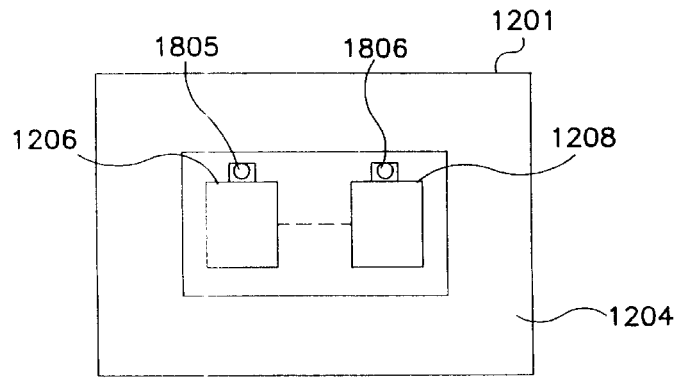
FIG. 15a is a plan view of a quartz plate according to Example 9.
Figure 15B:
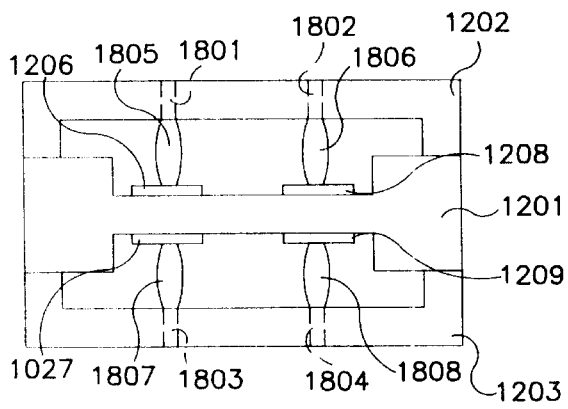
FIG. 15b is a cross-sectional view taken along the line 15b—15b of FIG. 14 according to Example 9.
Figure 15C:
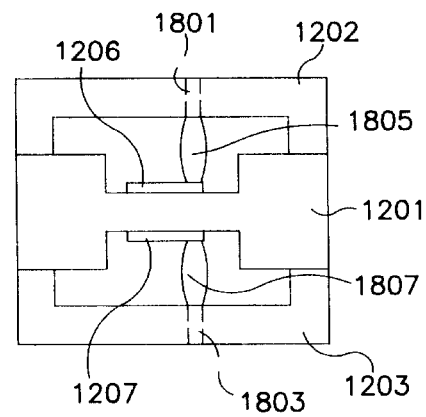
FIG. 15c is a cross-sectional view taken along the line 15c—15c of FIG. 14 according to Example 9.

FIG. 14 is a perspective view of the quartz filter according to Example 9. FIG. 15a is a top plan view of the quartz plate. FIG. 15b is a cross-sectional view taken along the line 15b—15b of FIG. 14, and FIG. 15c is a cross-sectional view taken along the line 15c—15c of FIG. 14.

In FIG. 14, the quartz filter includes a quartz plate 1201, a covering quartz plate 1202, and a base quartz plate 1203. The quartz plate 1201 is integrally and direct bonded with the covering quartz plate 1202 and the base quartz plate 1203 at direct bonding faces 1204 and 1205, respectively, without using adhesives. As shown in FIGS. 15a to 15c, electrodes 1206 to 1209 are formed on the quartz plate 1201. The central portion of the quartz plate 1201 is made thinner than the periphery thereof, and the thickness and the cutting angle of the quartz plate 1201 and the thickness and the patterned shape of the electrodes 1206 to 1209 are determined so as to obtain the desired filter characteristics.

An operation for thus obtained quartz filter of Example 9 is the same as that of Example 6, so that the description thereof will be omitted.

As is described above, the quartz plate 1201 having the electrodes 1206 and 1207 on each face thereof has the desired resonance characteristics. By direct bonding such a quartz plate with two quartz plates constituting the package without using adhesives, it is possible to reduce the deterioration due to age. In addition, according to Example 9, the quartz plates having the same thermal expansion coefficient are bonded together, so that a compact and simple quartz filter that is excellent in thermal stability can be obtained. In addition, according to Example 9, the thickness of the area of the quartz plate 1201 where the electrodes 1206 to 1209 are formed is made thinner than that of the areas where the quartz plate 1201 is supported by the covering quartz plate 1202 and the base quartz plate 1203, so that elastic vibrational energy at the quartz plate 1201 can be trapped within the area where electrodes 1206 and 1207 are formed, thereby realizing a quartz filter having a high Q value. The advantages provided by the above-mentioned structure of the quartz filter are the same as those of the quartz crystal resonator of Example 4.

EXAMPLE 10

Hereinafter, a quartz filter according to Example 10 of the present invention will be described with reference to FIGS. 16 and 17.

Figure 16:
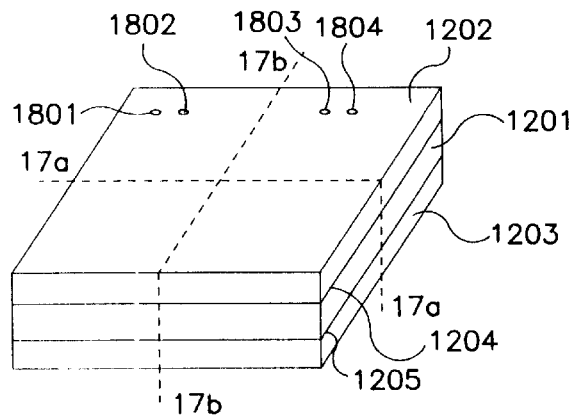
FIG. 16 is a perspective view of a quartz filter according to Example 10 of the present invention.
Figure 17A:
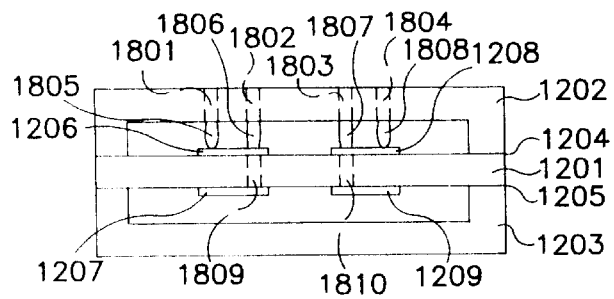
FIG. 17a is a cross-sectional view taken along the line 17a—17a of FIG. 16 according to Example 10.
Figure 17B:
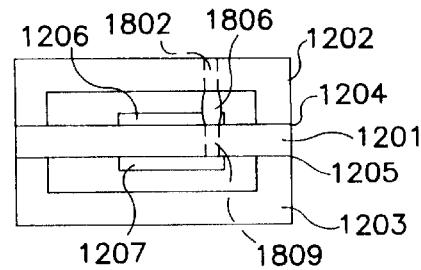
FIG. 17b is a cross-sectional view taken along the line 17b—17b of FIG. 16 according to Example 10.
Figure 17C:
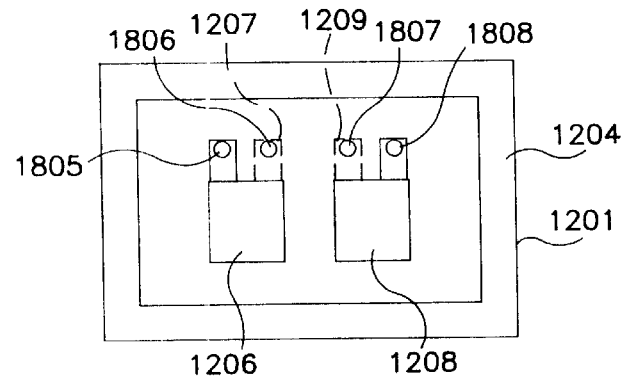
FIG. 17c is a plan view of a quartz plate according to Example 10.

FIG. 16 is a perspective view of the quartz filter according to Example 10. FIG. 17a is a cross-sectional view taken along the line 17a—17a of FIG. 16, and FIG. 17b is a cross-sectional view taken along the line 17b—17b of FIG. 16. FIG. 17c is a plan view of the quartz plate 1201.

In FIG. 16, the quartz filter includes a quartz plate 1201, a covering quartz plate 1202, and a base quartz plate 1203.

The quartz plate 1201 is integrally and direct bonded with the covering quartz plate 1202 and the base quartz plate 1203 at direct bonding faces 1204 and 1205, respectively, without using adhesives. Through-holes 1801 to 1804 each filled with a conductive material are formed in the covering quartz plate 1202. As shown in FIGS. 17a to 17c, electrodes 1206 to 1209 are formed on the quartz plate 1201. The reference numerals 1805 to 1808 indicate bumps. The quartz filter of Example 10 has the same structure as that of Example 6 excepting that through-holes 1809 and 1810 each filled with a conductive material are formed in the quartz plate 1201. Herein, the cutting angle and thickness of the quartz plate 1201 and the patterned shape and thickness of the electrodes 1206 to 1209 are determined so as to obtain the desired resonator characteristics. In addition, the electrodes 1206 to 1209 are electrically connected to the through-holes 1801 to 1804, 1809, and 1810 via the bumps 1805 to 1808.

An operation for the quartz filter of Example 10 is the same as that of Example 6, so that the description thereof will be omitted.

As is described above, the quartz plate 1201 having the electrodes 1206 and 1207 on each face thereof has the desired resonance characteristics. By direct bonding such a quartz plate with two quartz plates constituting the package without using adhesives, it is possible to reduce the deterioration due to age. In addition, according to Example 10, the quartz plates having the same thermal expansion coefficient are bonded together, so that a compact and simple quartz filter that is excellent in thermal stability can be obtained. Besides, the electrodes can be led to the outside of the package while the structure of the package remains perfect. In addition, by providing the through-holes 1809 and 1810 in the quartz plate 1201, external input/output terminals (herein, through-holes 1801 to 1804) can finally be disposed on one face of the package, which makes it advantageous to mount the quartz filter on a circuit board.

In Examples 6 to 10, each recessed portion of the quartz plate, the covering quartz plate, and the base quartz plate is formed by means of an ion-milling method by collision and sputtering of, say, inert gas ions such as $Ar^+$, a sandblasting method by collision and sputtering of sand particles under the presence of air, or an etching method by chemical reaction with, say, hydrofluoric acid.

In Examples 6 to 10, the ionic material for the covering member, the base member, and the body member are not limited to the quartz, but other ionic materials, for example fluorides such as LiF, NaF, and KF, oxides such as $Al_2O_3$, MgO, $TiO_2$, and $SiO_2$, chlorides such as LiCl, KCl, NaCl, and $CdCl_2$, intermediate compounds such as $MgAl_2O_4$, solid solution, or amorphous materials such as glass can also be employed for the quartz plates in the present invention. Furthermore, the ionic materials to be used in the present invention may be single-crystalline or polycrystalline materials.

In the case where an amorphous material such as glass, or a polycrystalline material is used, the thermal expansion coefficient thereof does not show anisotropy but isotropy, generally. Therefore the body member and the package member are not necessarily aligned in a specified crystal axis direction so as to avoid thermal stress.

In Examples 6 to 10, each shape of every component constituting the package is not particularly limited. For example, each shape of the recessed portions and the through-holes is not limited to the above-mentioned shape, but it may be a circle, a triangle, or any other desired shape.

In Examples 6 to 10, the materials, thickness, and the patterned shape of the electrodes are not limited to the above as long as the desired resonance characteristics can be obtained.

Figure 18:
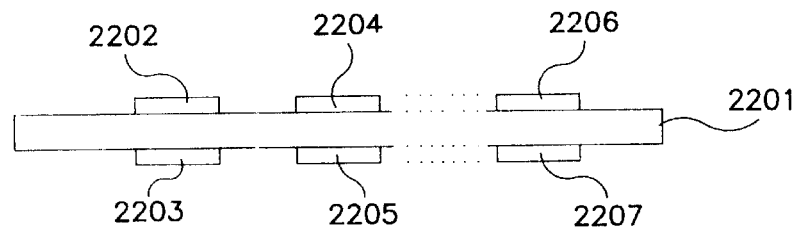
FIG. 18 exemplarily shows another structure for electrodes according to Examples 6 to 10.

In Examples 6 to 10, the number of electrodes is not limited to two pairs, but, for example, as shown in FIG. 18, three or more pairs of electrodes can be disposed on each face of a quartz plate 2201 (herein, electrodes 2202, 2204, and 2206 are disposed so as to be opposed to electrodes 2203, 2205, and 2207, respectively).

EXAMPLE 11

Hereinafter, a surface acoustic wave filter according to Example 11 of the present invention will be described with reference to FIG. 19.

Figure 19:
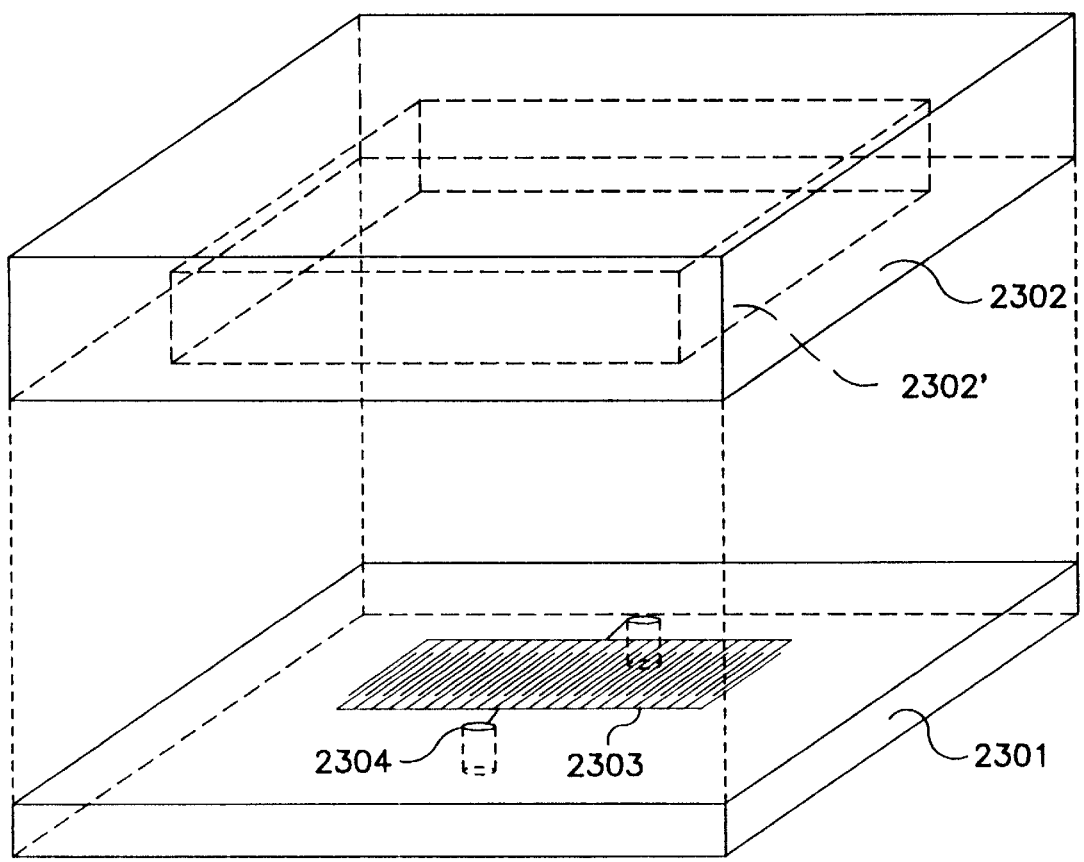
FIG. 19 shows a structure for a surface acoustic wave filter according to Example 11 of the present invention.

In FIG. 19, the surface acoustic wave filter includes a quartz substrate 2301 and a covering member 2302 made of quartz. Herein, an electrode 2303 is disposed on the quartz substrate 2301. Two through-holes 2304 each filled with a conductive material are formed in the quartz substrate 2301 as an input terminal and an output terminal, respectively. The electrode 2303 is electrically connected to the outside via the through-holes 2304. At almost the central portion of the covering member 2302, a recessed portion 2302' is formed so as to cover the electrode 2303 and the through-holes 2304. Furthermore, the quartz substrate 2301 and the covering member 2302 are integrally and direct bonded with each other so that the electrode 2303 is packaged in the recessed portion 2302'.

Next, an operation for the surface acoustic wave filter of Example 11 will be described.

As shown in FIG. 19, under the condition where the IDT type electrode 2303 is disposed on the face of the quartz substrate 2301, when an electrical signal is inputted, the surface acoustic wave is excited on the face of the quartz substrate 2301, and consequently only waves having certain frequencies can be propagated. Herein, the electrode pattern of the IDT type electrode 2303 and the effective piezoelectric constant of the quartz substrate 2301 determine which surface acoustic waves can be propagated. That is, such a surface acoustic wave filter can be used as a band-pass filter for passing only electrical signals with certain frequencies.

As is described above, according to Example 11, the quartz substrate 2301 and the covering member 2302 are direct bonded with each other without using adhesives, which makes it possible to eliminate the additional space needed for the adhesives. More advantageously, no gas is caused in the hermetically packaged filter. Thus, a compact and high performable surface acoustic wave filter without causing deterioration due to age can be obtained.

EXAMPLE 12

Hereinafter, a surface acoustic wave filter according to Example 12 of the present invention will be described with reference to FIG. 20.

Figure 20:
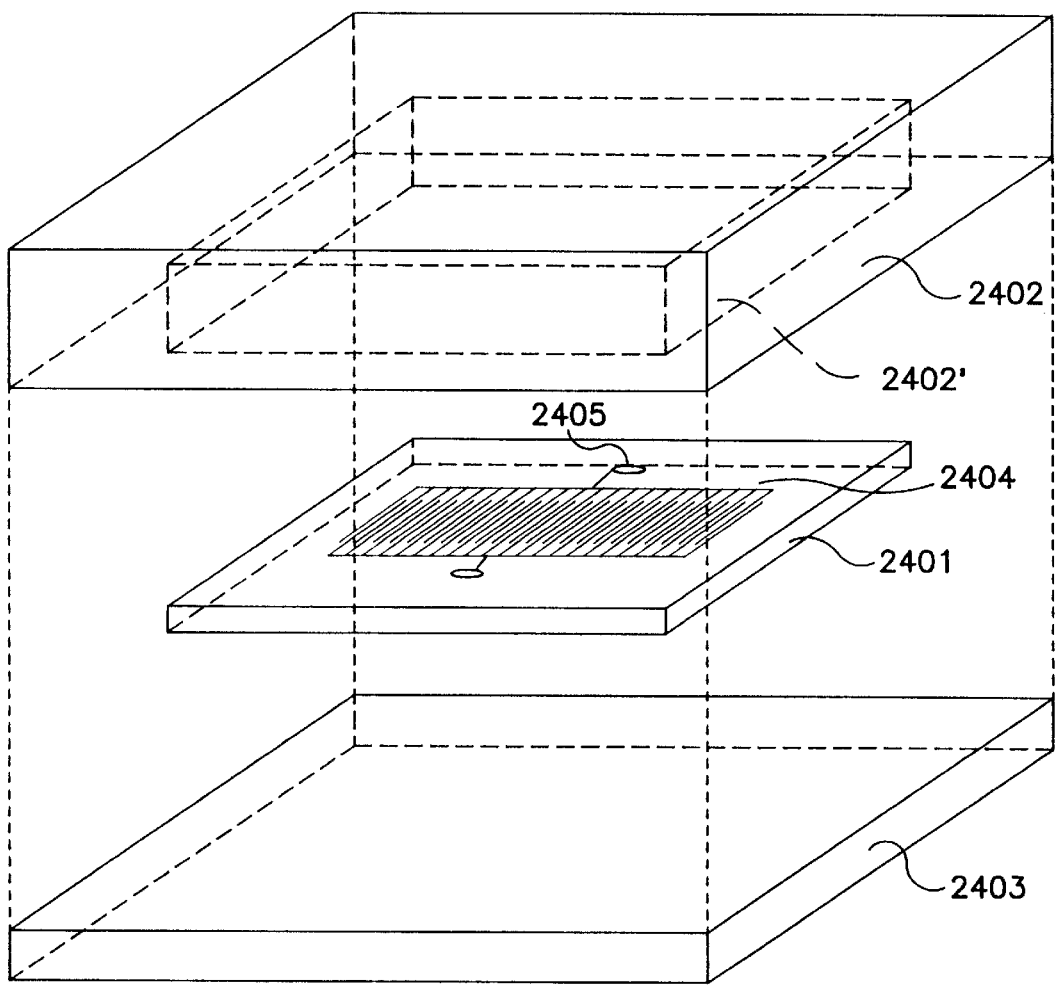
FIG. 20 shows a structure for a surface acoustic wave filter according to Example 12 of the present invention.

In FIG. 20, the surface acoustic wave filter includes a quartz substrate 2401, a covering member 2402, and a base member 2403. The covering member 2402 and the base member 2403 are both made of quartz. Herein, an electrode 2404 is disposed on the quartz substrate 2401. Two bonding pads 2405 each filled with a conductive material are formed in the quartz substrate 2401 as an input terminal and an output terminal, respectively. The electrode 2404 is electrically connected to the outside via the bonding pads 2405. At almost the central portion of the covering member 2402, a recessed portion 2402' is formed so as to contain the quartz substrate 2401. Furthermore, the quartz substrate 2401 and the base member 2403 are integrally and direct bonded with each other, while the base member 2403 and the covering member 2402 are integrally and direct bonded with each other.

An operation for the surface acoustic wave filter of Example 12 is the same as that of Example 11, so that the description thereof will be omitted.

As is described above, according to Example 12, the base member 2403 is direct bonded with the quartz substrate 2401 and the covering member 2402 without using adhesives, which makes it possible to eliminate the additional space needed for the adhesives. More advantageously, no gas is caused in the hermetically packaged filter. Thus, a compact and high performable surface acoustic wave filter without causing deterioration due to age can be obtained. In addition, according to Example 12, the quartz substrate 2401 is mounted on the face of the base member 2403 where the electrode 2404 is not disposed. As a result, even if the circuit board on which the surface acoustic wave filter is mounted has a different thermal expansion coefficient from that of the quartz substrate 2401, the thermal stress which is caused due to the difference in the thermal expansion coefficient can be absorbed, thereby advantageously reducing the change in the filter characteristics.

EXAMPLE 13

Hereinafter, a surface acoustic wave filter according to Example 13 of the present invention will be described with reference to FIG. 21.

Figure 21:
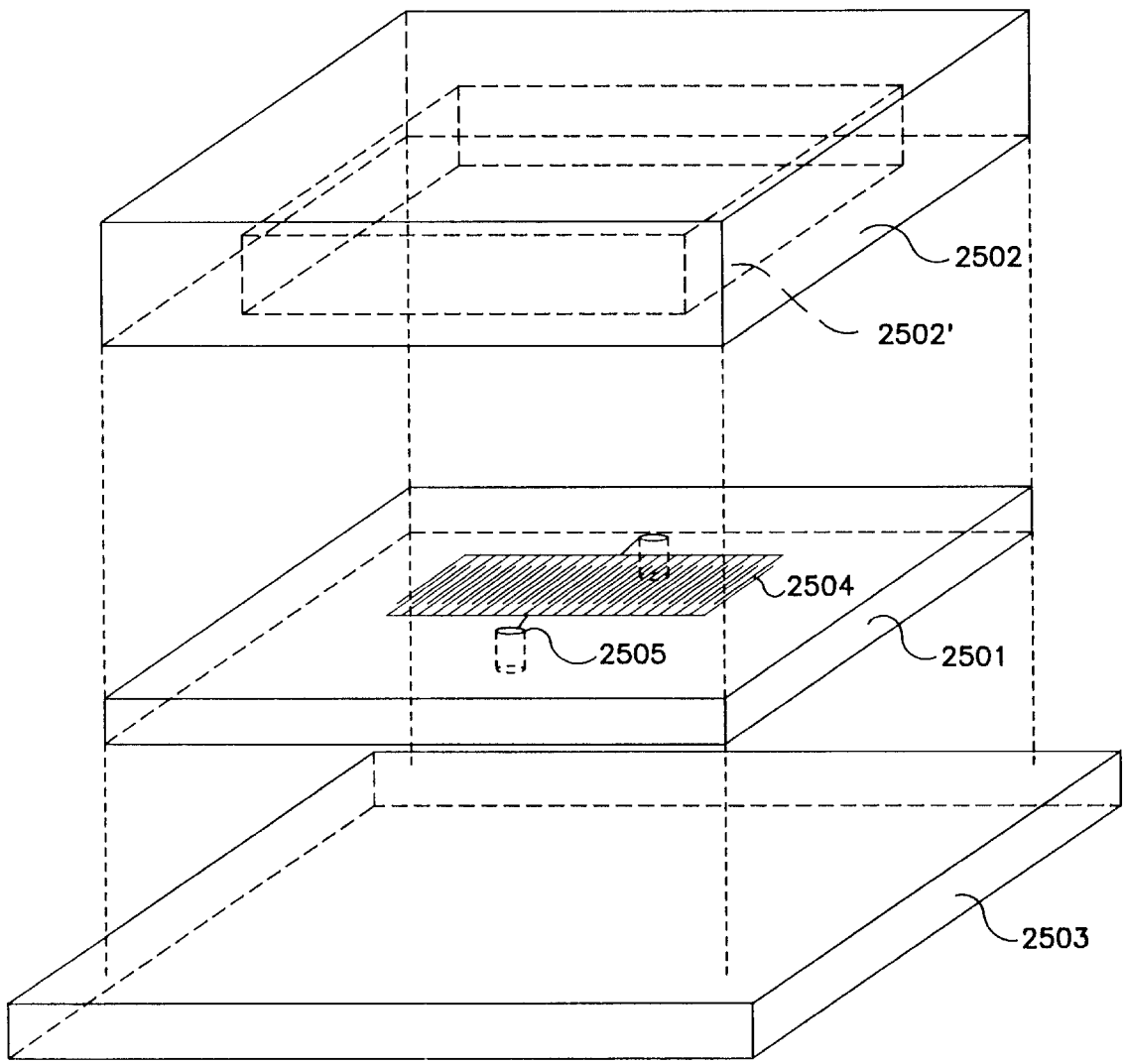
FIG. 21 shows a structure for a surface acoustic wave filter according to Example 13 of the present invention.

In FIG. 21, the surface acoustic wave filter includes a quartz substrate 2501, a covering member 2502, and a base member 2503. The covering member 2502 and the base member 2503 are both made of quartz. Herein, an electrode 2504 is disposed on the quartz substrate 2501. Two through-holes 2505 each filled with a conductive material are formed in the quartz substrate 2501 as an input terminal and an output terminal, respectively. The electrode 2504 is electrically connected to the outside via the through-holes 2505. At almost the central portion of the covering member 2502, a recessed portion 2502' is formed so as to cover the quartz substrate 2501. Furthermore, the quartz substrate 2501 and the covering member 2502 are integrally and direct bonded with each other.

An operation for the surface acoustic wave filter of Example 13 is the same as that of Example 11, so that the description thereof will be omitted.

As is described above, according to Example 13, the quartz substrate 2501 and the covering member 2502 are direct bonded with each other without using adhesives, which makes it possible to eliminate the additional space needed for the adhesives. More advantageously, no gas is caused in the hermetically packaged filter. Thus, a compact and high performable surface acoustic wave filter without causing deterioration due to age can be obtained. In addition, according to Example 13, the quartz substrate 2501 is mounted on the face of the base member 2503 where the electrode 2504 is not disposed. As a result, even if the circuit board on which the surface acoustic wave filter is mounted has a different thermal expansion coefficient from that of the quartz substrate 2501, the thermal stress which is caused due to the difference in the thermal expansion coefficient can be absorbed, thereby advantageously reducing the change in the filter characteristics. Herein, it is not necessary to direct bond the quartz substrate 2501 and the base member 2503 with each other since the electrode 204 has already been packaged by the quartz substrate 2501 and the recessed portion 2502'.

EXAMPLE 14

Hereinafter, a surface acoustic wave filter according to Example 14 of the present invention will be described with reference to FIG. 22.

Figure 22:
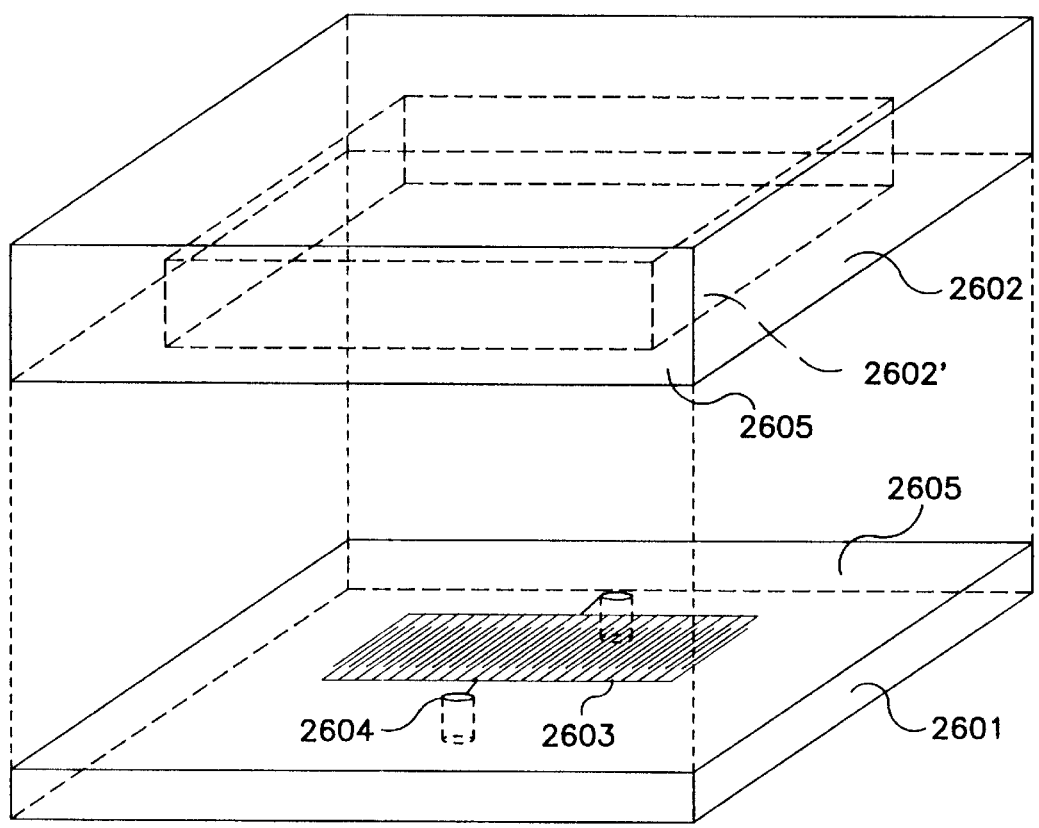
FIG. 22 shows a structure for a surface acoustic wave filter according to Example 14 of the present invention.

In FIG. 22, the surface acoustic wave filter includes a quartz substrate 2601 and a covering member 2602. An electrode 2603 is disposed on the quartz substrate 2601. Two through-holes 2604 each filled with a conductive material are formed in the quartz substrate 2601 as an input terminal and an output terminal, respectively. The electrode 2603 is electrically connected to the outside via the through-holes 2604. At almost the central portion of the covering member 2602, a recessed portion 2602' is formed so as to cover the quartz substrate 2601. Furthermore, the area where the quartz substrate 2601 and the covering member 2602 are direct bonded with each other is previously covered with an ionic material, thus forming an ionic material covering portion 2605. In Example 14, the quartz substrate 2601 and the covering member 2602 are direct bonded with each other using adhesive force generated between the ionic materials thereof.

An operation for the surface acoustic wave filter of Example 14 is the same as that of Example 11, so that the description thereof will be omitted.

As is described above, according to Example 14, the quartz substrate 2601 and the covering member 2602 are direct bonded with each other via the ionic material covering portion 2605 without using adhesives, which makes it possible to eliminate the additional space needed for the adhesives. More advantageously, no gas is caused in the hermetically packaged filter. Thus, a compact and high performable surface acoustic wave filter without causing deterioration due to age can be obtained. Furthermore, by providing the ionic material covering portion 2605, the quartz substrate 2601 and the covering member 2602 can be made considering the filter characteristics (elastic constant, electrical and mechanical coupling constant, etc.), workability, and production cost so as to optimize the surface acoustic wave filter. As a method for covering the ionic material covering portion 2605 with the ionic material, a chemical vapor deposition (CVD) method in which the raw material for the ionic material is decomposed in a vapor condition so as to deposit ionic material, a sputtering method in which a target, which is the raw material for the ionic material in vacuum comes into collision with high speed charged particles so as to be vaporized, and the like may be employed. In the case where an oxide of the piezoelectric material (namely, in this example, quartz substrate 2601) and the covering member 2602 is ionic, a method in which the face of a parent material is oxidized so as to form a thin oxide layer can be employed. In the case where the CVD method or sputtering method is employed, a buffer layer can be formed so as to achieve excellent bonding between the ionic material to be formed at a face and the parent material, thereby stably forming the ionic material on the face of the parent material.

EXAMPLE 15

Hereinafter, a surface acoustic wave filter according to Example 15 of the present invention will be described with reference to FIG. 23.

Figure 23:
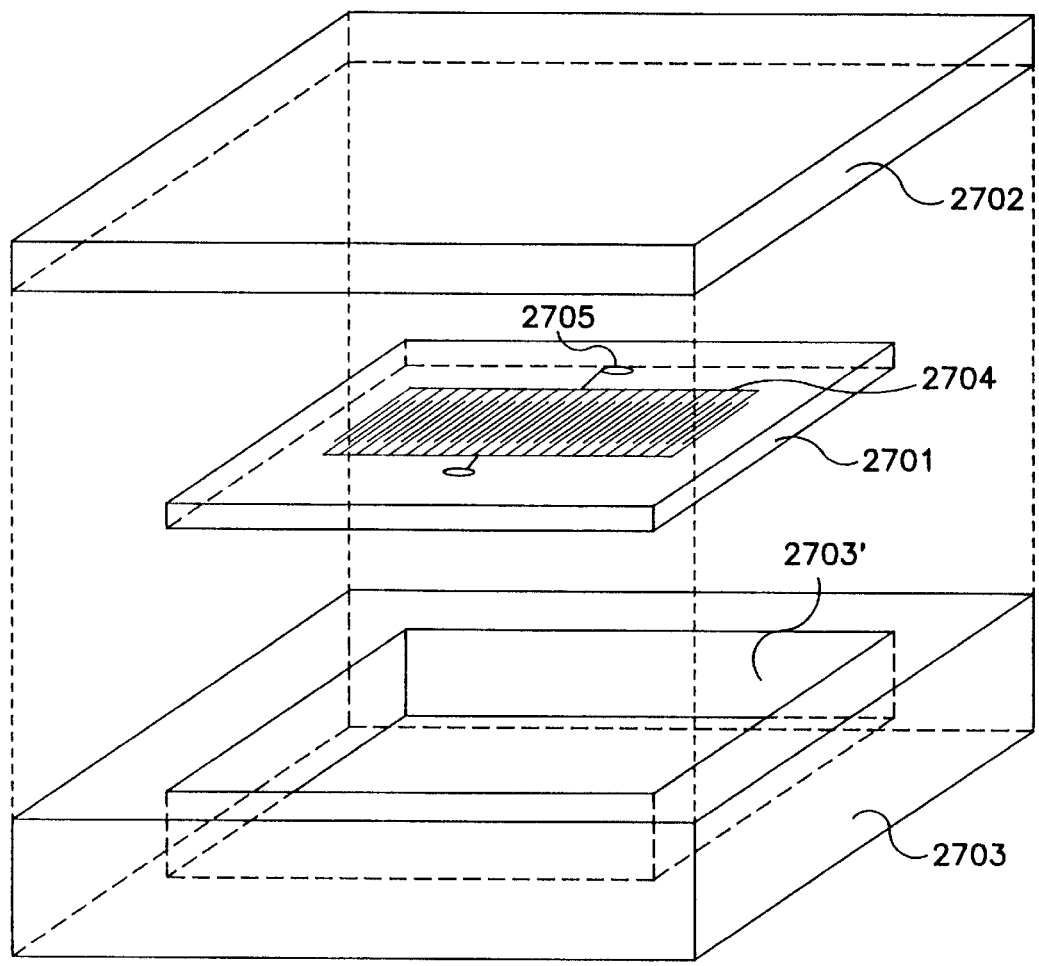
FIG. 23 shows a structure for a surface acoustic wave filter according to Example 15 of the present invention.
Figure 30:
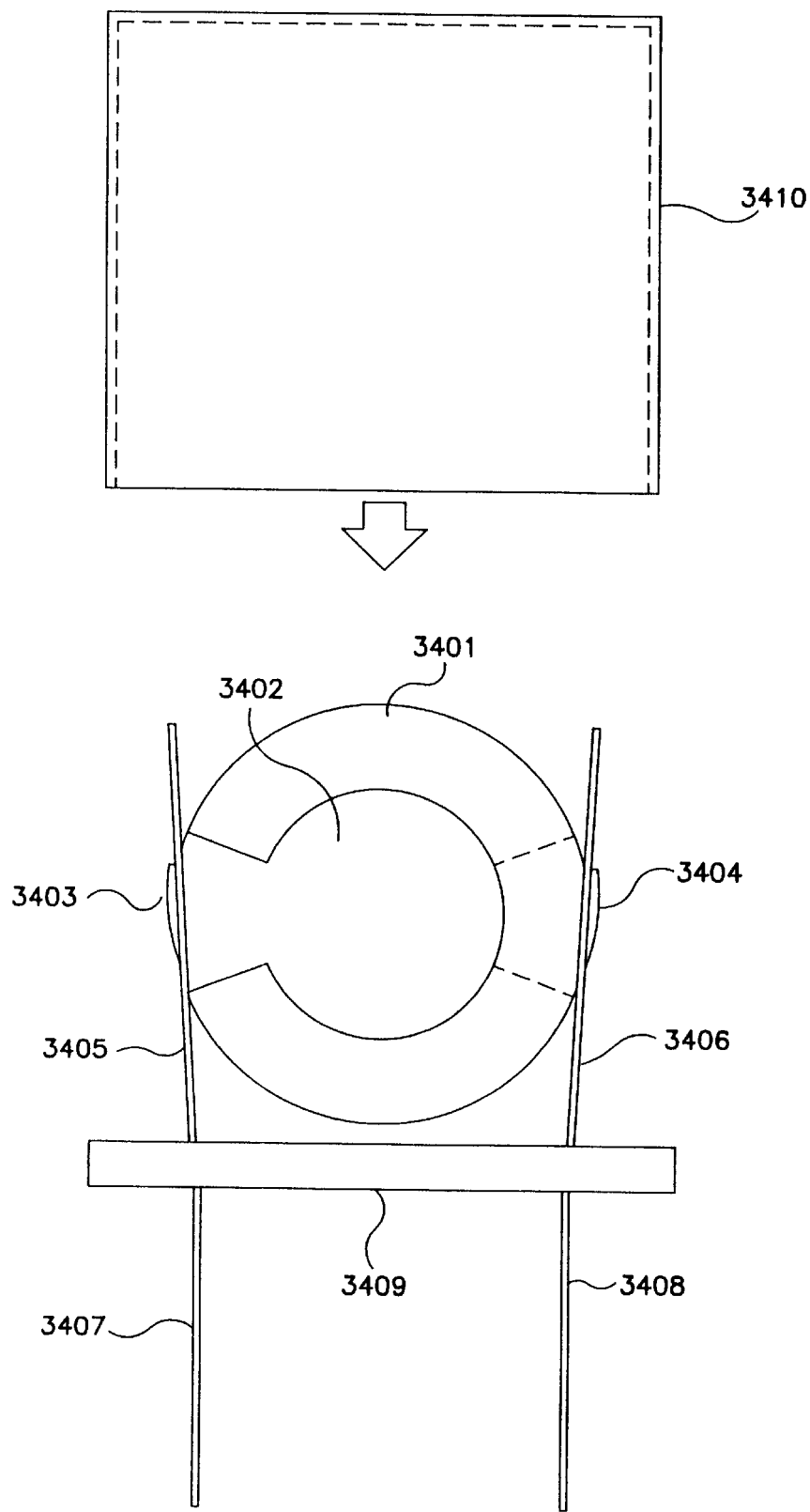
FIG. 30 shows an exemplary structure for a conventional quartz crystal resonator.
Figure 3I:
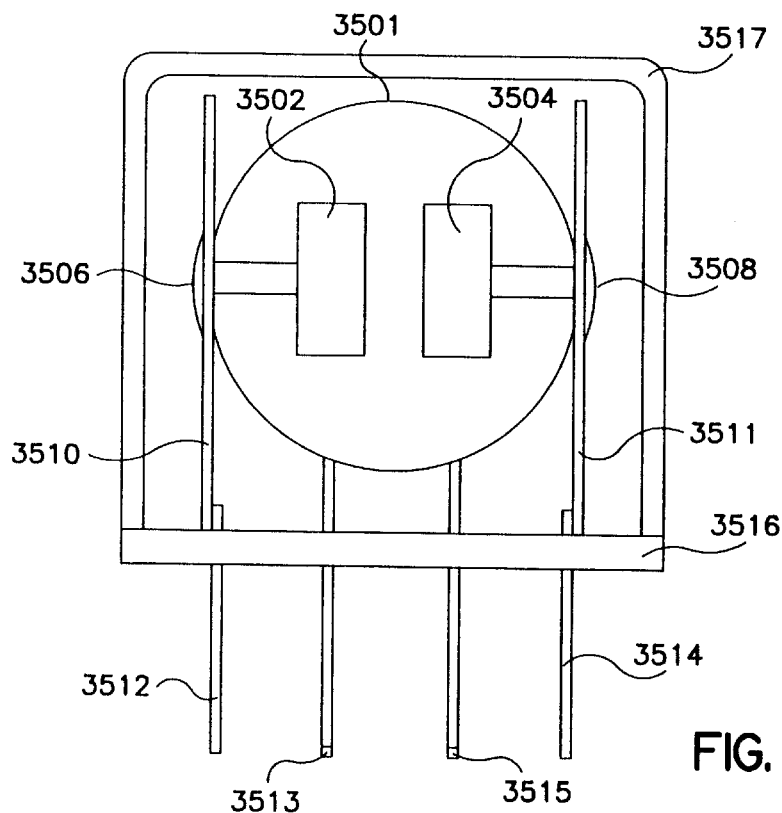
Figure 3I:
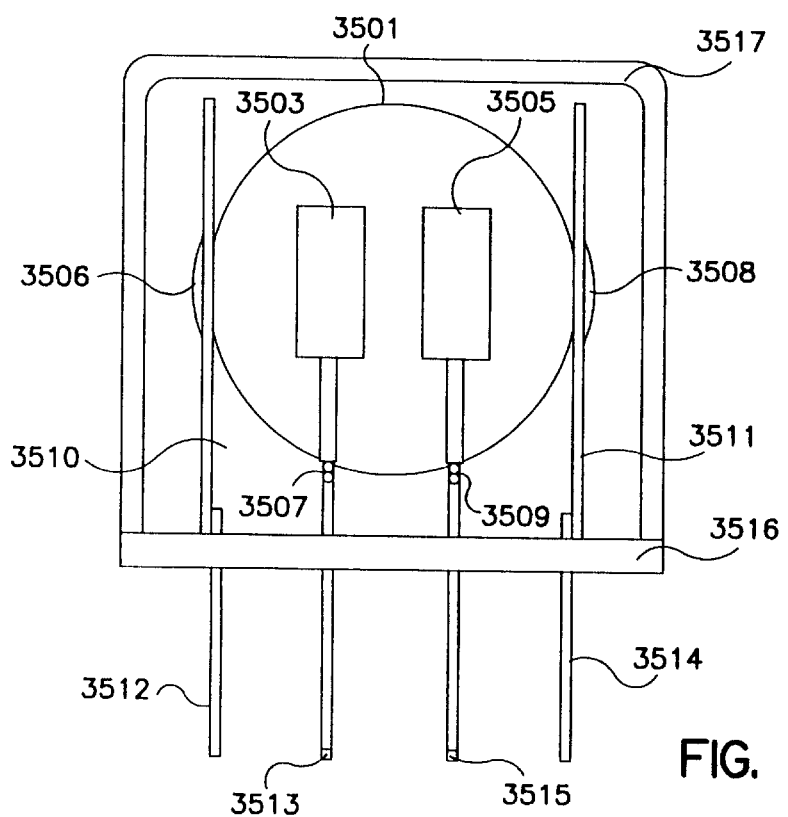
Figure 32:
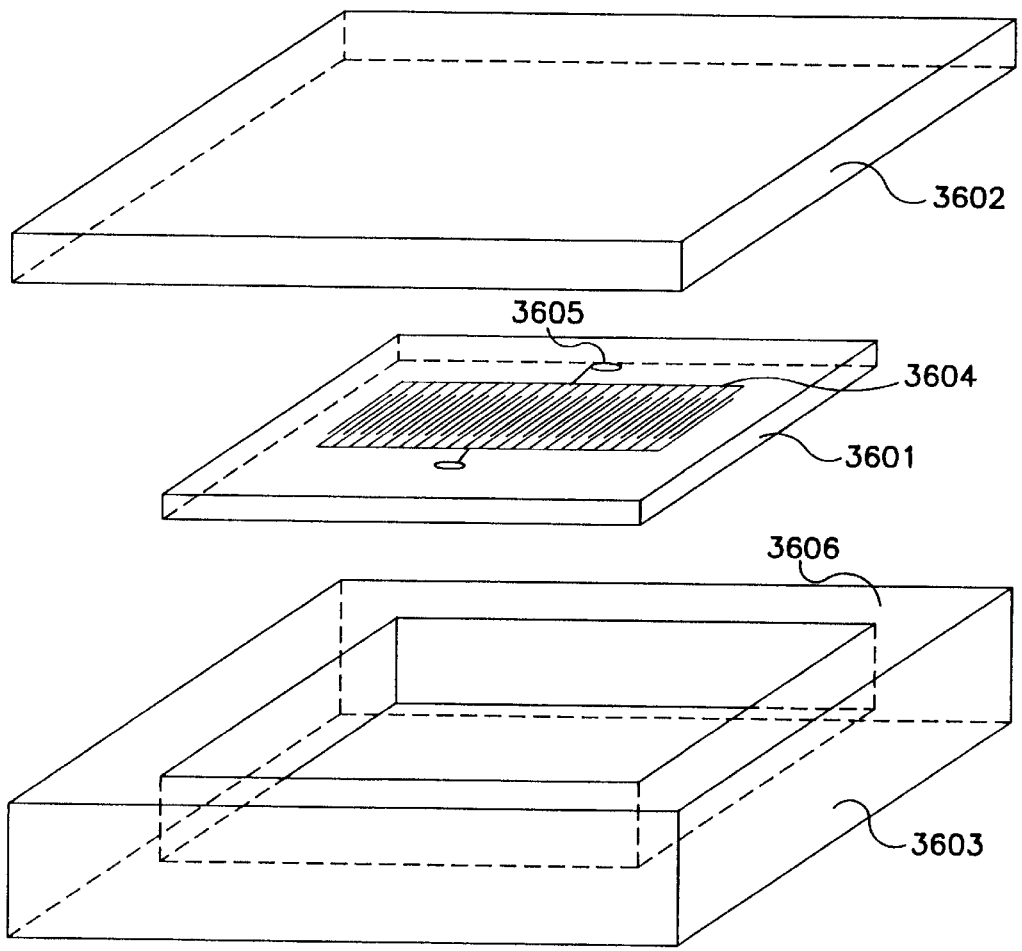
FIG. 32 shows an exemplary structure for a conventional surface acoustic wave filter.
Figure 33:
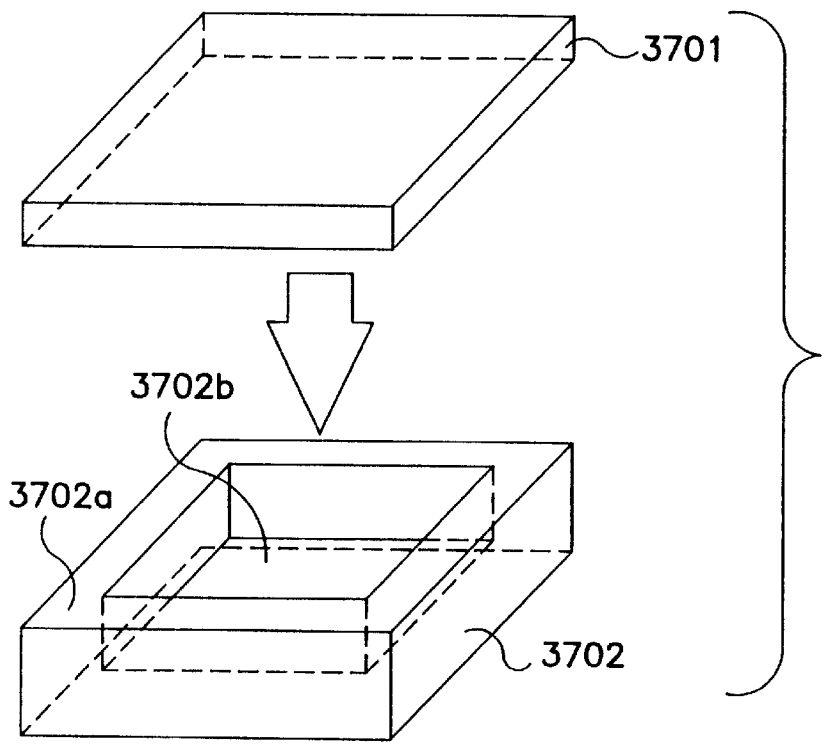
FIG. 33 is a perspective view showing an exemplary structure for a conventional package.

In FIG. 23, the surface acoustic wave filter includes a quartz substrate 2701, a covering member 2702, and a base member 2703. The covering member 2702 and the base member 2703 are both made of quartz. An electrode 2704 is disposed on the quartz substrate 2701. Two bonding pads 2705 each filled with a conductive material are formed in the quartz substrate 2701 as an input terminal and an output terminal, respectively. The electrode 2704 is electrically connected to the outside via the bonding pads 2705. At almost the central portion of the base member 2703, a recessed portion 2703' is formed so as to contain the quartz substrate 2701. Furthermore, the base member 2703 is integrally and direct bonded with the quartz substrate 2701 and the covering member 2702.

An operation for the surface acoustic wave filter of Example 15 is the same as that of Example 11, so that the description thereof will be omitted.

As is described above, according to Example 15, the base member 2703 is direct bonded with the quartz substrate 2701 and the covering member 2702 without using adhesives, which makes it possible to eliminate the additional space needed for the adhesives. More advantageously, no gas is caused in the hermetically packaged filter. Thus, a compact and high performable surface acoustic wave filter without causing deterioration due to age can be obtained. In addition, according to Example 15, the quartz substrate 2701 is mounted on the face of the base member 2703 where the electrode 2704 is not disposed. As a result, even if a circuit board on which the surface acoustic wave filter is mounted has a different thermal expansion coefficient from that of the quartz substrate 2701, the thermal stress which is generated due to the difference in the thermal expansion coefficient can be absorbed, thereby advantageously reducing the change in the filter characteristics.

In Examples 11 to 13, and 15, the covering member and the base member are made of quartz, but they may be made of any other materials as long as the direct bonding can be achieved.

In Examples 11 to 15, the piezoelectric substrate is made of quartz, but it may be made of any other materials such as lithium niobate ($LiNbO_3$) and lithium tantalate ($LiTaO_3$). Even if the piezoelectric substrate is made of materials other than the quartz, the same effects can be obtained as long as the piezoelectric substrate is direct bonded with the covering member and the base member.

In Examples 11 to 15, the electrodes are led to the outside via the through-holes or bonding pads. However, the method for leading the electrodes to the outside is not limited to the above method. In the case where earthed electrodes are used, the method for leading the electrodes to the outside is not limited to the above method.

In Examples 13 and 15, the covering member and the base member can be made of the same material, so that they can have the same thermal expansion coefficient, thereby realizing a higher reliable surface acoustic wave filter.

In Examples 11 to 15, even if the piezoelectric substrate is made of a material other than the quartz, such as lithium niobate ($LiNbO_3$) and lithium tantalate ($LiTaO_3$), the covering member and the base member can be made of the same material as that of the piezoelectric substrate to have the same thermal expansion coefficient, thereby realizing a high reliable surface acoustic wave filter.

In Examples 11 to 13, and 15, the covering member and the base member can be covered with the ionic material in the same manner as the covering member of Example 14. As a result, the covering member and the base member can be made considering the workability, and production cost so as to provide a higher performable surface acoustic wave filter at a low cost. Even when a material other than the quartz, such as lithium niobate ($LiNbO_3$) and lithium tantalate ($LiTaO_3$) is used, the same effects can be obtained.

In Examples 11 to 15, the materials for the covering member and the base member are not limited particularly, but any other ionic materials, for example, fluorides such as LiF, NaF, and KF, chlorides such as LiCl, KCl, NaCl, and $CdCl_2$, oxides such as $Al_2O_3$, MgO, $SiO_2$, and $TiO_2$, intermediate compounds such as $MgAl_2O_4$, solid solution, and amorphous materials such as glass can also be employed in the present invention. Furthermore, the ionic materials to be used in the present invention may be single-crystalline or polycrystalline materials.

In the case where an amorphous material such as glass, or a polycrystalline material is used, the thermal expansion coefficient thereof does not show anisotropy but isotropy. Therefore, the body member and the covering member are not necessary aligned in a specified crystal axis direction so as to avoid thermal stress. In addition, by appropriately choosing the compositions of the ionic material to be used, it is possible to make the piezoelectric substrate, the covering member, and the base member have the same thermal expansion coefficient, thereby realizing a thermally reliable package.

As an ionic material used in the device of the present invention, an ionic material which has covalent bonding property can be used as long as the direct bonding can be formed. In general, an ionic material has ionic bonding property as well as covalent bonding property as described in, for example, "Introduction to Solid State Physics", 5th edit., by Charles Kittel (1976), John Wiley & Sons Inc.

In Examples 11 to 15, the IDT type electrodes alone are shown, but other electrodes such as earthed electrodes and reflecting electrodes may additionally be provided. Moreover, the electrode pattern of the electrodes on the piezoelectric substrate is not particularly limited.

EXAMPLE 16

Hereinafter, a package according to Example 16 will be described with reference to FIG. 24.

In FIG. 24, the package includes a covering member 2801 and a body member 2802. The covering member 2801 and the body member 2802 are both made of an ionic material such as aluminum oxide ($Al_2O_3$), magnesium oxide (MgO), and silicon oxide ($SiO_2$). At almost the central portion of the body member 2802, an recessed portion 2802b is formed. At the periphery of the recessed portion 2802b, a direct bonding face 2802a is formed and polished so as to be flat. On the other hand, the covering member 2801 is sufficiently large to package the recessed portion 2802b, and has a direct bonding face 2801a which is polished so as to be flat similarly to the direct bonding face 2802a.

The package according to Example 16 has adhesion at the direct bonding faces 2801a and 2802a using direct bonding, thereby eliminating conventional adhesives, low melt glass, etc. According to such a packaging method, the package can be made compact without necessitating the additional space for the adhesives, the low melting point glass, etc. For providing the recessed portion 2802b at the body member 2802, a sandblasting method in which sand particles are sprayed using high pressure gas for the polishing or an etching method utilizing chemical reaction can be employed.

EXAMPLE 17

Hereinafter, a package according to Example 17 will be described with reference to FIG. 25.

In FIG. 25, the package includes a covering member 2901, a body member 2902, and a base member 2903. The covering member 2901, the body member 2902, and the base member 2903 are all made of an ionic material such as aluminum oxide ($Al_2O_3$), magnesium oxide (MgO), and silicon oxide ($SiO_2$). At almost the central portion of the body member 2902, an opening 2902b is formed. At the periphery of the opening 2902b, a direct bonding face 2902a is formed and polished so as to be flat. On the other hand, the covering member 2901 and the base member 2903 are sufficiently large to package the opening 2902b, and have direct bonding faces 2901a and 2903a, respectively, which are polished so as to be flat similarly to the direct bonding face 2902a. According to the same packaging method employed as that of Example 16, the covering member 2901 and the body member 2902 are direct bonded with each other at the direct bonding faces 2901a and 2902a. The body member 2902 and the base member 2903 are direct bonded with each other at the direct bonding faces 2902a and 2903a.

According to such a packaging method, the package can be made compact without necessitating the additional space needed for the adhesives, the low melting point glass, etc.

EXAMPLE 18

Hereinafter, a package according to Example 18 will be described with reference to FIG. 26.

In FIG. 26, the package includes a covering member 3001, and a body member 3002. The covering member 3001 and the body member 3002 are both made of an ionic material such as aluminum oxide ($Al_2O_3$), magnesium oxide (MgO), and silicon oxide ($SiO_2$). At almost the central portion of the body member 3002, a recessed portion 3002b is formed. At the periphery of the recesed portion 3002b, a direct bonding face 3002a is formed and polished so as to be flat. On the other hand, the covering member 3001 is sufficiently large to package the recessed portion 3002b, and has a direct bonding face 3001a which is polished so as to be flat similarly to the direct bonding face 3002a. Furthermore, the covering member 3001 is provided with through-holes 3003 each filled with a conductive material and bumps 3004 each extending from the throughhole 3003, so that an object to be packaged (such as an IC and quartz crystal devices) can be electrically connected to the outside.

In Example 18, the through-holes 3003 and the bumps 3004 are provided in order to electrically connect the object to be packaged to the outside. According to the same packaging method employed as that of Example 16, the covering member 3001 and the body member 3002 are direct bonded with each other at the direct bonding faces 3001a and 3002a.

According to such a packaging method, the package can be made compact without necessitating the additional space for the adhesives, the low melting point glass, etc.

In Examples 16 to 18, each shape of every components constituting the package is not particularly limited. For example, each shape of the openings is not limited to the above-mentioned shape, but it may be a circle, a triangle, or any other desired shape as long as the body member, the covering member, and the base member are made of ionic materials so that the opening can be packaged using the adhesive force generated between the ionic materials.

In Examples 16 and 17, the through-holes and the bumps extending therefrom can be formed in the covering member, the body member, and the base member so as to electrically connect the object to be packaged to the outside as done in Example 18.

In Examples 16 to 18, the materials for the covering member, the base member and the body member are not limited to the above, but any other ionic materials, for example fluorides such as LiF, NaF, and KF, chlorides such as LiCl, KCl, NaCl, and $CdCl_2$, metal oxides such as $TiO_2$, intermediate compounds such as $MgAl_2O_4$, solid solution, or amorphous materials such as glass can also be employed in the present invention. Furthermore, the ionic materials to be used in the present invention may be single-crystalline or polycrystalline materials.

In the case where an amorphous material such as glass, or a polycrystalline material is used, the thermal expansion coefficient thereof does not show anisotropy but isotropy. Therefore, the body member and the covering member are not necessary aligned in a specified crystal axis direction to avoid thermal stress. In addition, by appropriately choosing the compositions of the ionic material to be used, it is possible to make the object such as an IC substrate to be packaged and the package have the same thermal expansion coefficient, thereby realizing a thermally reliable package.

In Examples 16 to 18, an ionic material which has some covalent bonding property can be used as an ionic material.

In Examples 16 to 18, by providing the through-holes filled with a conductive material and the metal bumps extending therefrom in the covering member, the body member, or the base member, it is possible to electrically connect the object to be packaged via the through-holes and bumps.

EXAMPLE 19

Hereinafter, a package according to Example 19 will be described with reference to FIG. 27.

In FIG. 27, the package includes a covering member 3101 and a body member 3102. The covering member 3101 and the body member 3102 are both made of metal, ceramic, or the like. At almost the central portion of the body member 3102, a recessed portion 3102b is formed. At the periphery of the recessed portion 3102b, a direct bonding face 3102a is formed and polished so as to be flat. The direct bonding face 3102a is covered with an ionic material such as aluminum oxide ($Al_2O_3$), magnesium oxide (MgO), and silicon oxide ($SiO_2$). On the other hand, the covering member 3101 is sufficiently large to package the recessed portion 3102b, and has a direct bonding face 3101a which is polished so as to be flat and covered with an ionic material similarly to the direct bonding face 3102a.

As a method for covering the direct bonding faces 3102a and 3101a with the ionic material, a chemical vapor deposition (CVD) method in which a raw material for the ionic material is decomposed in a vapor condition so as to deposit ionic material on the faces of the covering member 3101 and the body member 3102, a sputtering method in which a target which is a raw material for the ionic material in vacuum comes into collision with the high speed charged particles so as to be vaporized, thereby forming an ionic material film on the faces of the covering member 3101 and the body member 3102, and the like may be employed. In the case where an oxide used in the covering member 3101 and the body member 3102 is ionic, a method in which the face of a parent material is oxidized so as to form an oxide film can be employed. In the case where the CVD method or sputtering method is employed, a buffer layer can be formed to achieve excellent bonding between the ionic material to be formed at a face and the parent material, thereby stably forming the ionic material on the face of the parent material.

According to such a packaging method where the direct bonding faces 3101a and 3102a are covered with the ionic materials for direct bonding, the package can be made compact without necessitating the additional space needed for the adhesives, the low melting point glass, and the like. Generally, it is difficult to provide such a recessed portion 3102b at the body portion 3102 due to the inferiority of the processability of the ionic material. However, according to the present invention, the direct bonding faces are covered with ionic materials, so that economical materials with excellent processability can be employed for the parent material, thereby readily providing a package having a desired shape at a low cost.

EXAMPLE 20

Hereinafter, a package according to Example 20 will be described with reference to FIG. 28.

In FIG. 28, the package includes a covering member 3201, a body member 3202, and a base member 3203. The covering member 3201, the body member 3201, and the base member 3203 are all made of metal, ceramic, or the like. At almost the central portion of the body member 3202, an opening 3202b is formed. At the periphery of the opening 3202b, a direct bonding face 3202a is formed and polished so as to be flat. The direct bonding face 3202a is covered with an ionic material such as aluminum oxide ($Al_2O_3$), magnesium oxide (MgO), and silicon oxide ($SiO_2$). On the other hand, the covering member 3201 and the base member 3203 are sufficiently large to package the opening 3202b, and have direct bonding faces 3201a and 3203a, respectively, which are polished so as to be flat and covered with an ionic material similarly to the direct bonding face 3202a. As a method for covering the direct bonding faces 3201a, 3202a, and 3203a with the ionic material, the CVD method, the sputtering method, or the oxidization method can be employed as done in Example 19.

According to the same packaging method as that of Example 19, the covering member 3201, the body member 3202, and the base member 3203 are bonded with one another at the direct bonding faces 3201a, 3202a, and 3203a.

According to such a packaging method, the package can be made compact without necessitating the additional space needed for the adhesives, the low melting point glass, and the like. Generally, it is difficult to provide such a opening 3202b at the body portion 3202 due to the inferiority of the processability of the ionic material. However, according to the present invention, the direct bonding faces are covered with ionic materials, so that economical materials with excellent processability can be employed for the parent material, thereby readily providing a package having a desired shape at a low cost.

EXAMPLE 21

Hereinafter, a package according to Example 21 will be described with reference to FIG. 29.

In FIG. 29, the package includes a covering member 3301 and a body member 3302. The covering member 3301 and the body member 3302 are both made of metal, ceramic, or the like. At almost the central portion of the body member 3302, a recessed portion 3302b is formed. At the periphery of the recessed portion 3302b, a direct bonding face 3302a is formed and polished so as to be flat. The direct bonding face 3302a is covered with an ionic material such as aluminum oxide ($Al_2O_3$), magnesium oxide (MgO), and silicon oxide ($SiO_2$). On the other hand, the covering member 3301 is sufficiently large so as to package the recessed portion 3302b, and has a direct bonding face 3301a which is polished so as to be flat and covered with an ionic material similarly to the direct bonding face 3302a.

The direct bonding faces 3301a and 3302a are covered with the ionic material in the same manner as that of Example 19, using the CVD method, the sputtering method, the oxidization method, and the like. Furthermore, the covering member 3301 is provided with through-holes 3303 filled with a conductive material and bumps 3304 each extending from the through-hole 3303, so that an object to be packaged (such as an IC and quartz crystal devices) can be electrically connected to the outside.

In Example 21, the through-holes 3303 and the bumps 3304 are provided in order to electrically connect the object to be packaged to the outside. According to the same packaging method employed as that of Example 19, the covering member 3301 and the body member 3302 are direct bonded with each other at the direct bonding faces 3301a and 3302a.

According to such a packaging method, the package can be made compact without necessitating the additional space for the adhesives, the low melting point glass, and the like.

In Examples 19 to 21, each shape of every components constituting the package is not particularly limited. For example, each shape of the openings is not limited to the above-mentioned shape, but it may be a circle, a triangle, or any other desired shape as long as the direct bonding faces are covered with ionic materials so that the opening can be sealed using the adhesive force generated between the ionic materials.

In Examples 19 to 21, the materials for covering the direct bonding faces are not limited to the above, but any other ionic materials, for example fluorides such as LiF, NaF, and KF, chlorides such as LiCl, KCl, NaCl, and $CdCl_2$, metal oxides such as $TiO_2$, intermediate compounds such as $MgAl_2O_4$, and solid solution can be employed.

In Examples 19 to 21, an ionic material which has some covalent bonding property can be used as an ionic material.

In Examples 19 to 21, the direct bonding faces alone are covered with ionic materials, but the other faces may also be covered with the ionic materials for convenience of manufacturing process, or the like.

According to the present invention, the package can be obtained through direct bonding. As a result, the package of the present invention does not require adhesives, thereby not causing gas, and eliminating the additional space needed for the adhesives. Consequently, a compact, high performable, and economical quartz crystal device or package capable of performing excellent hermetic packaging operation without causing deterioration due to age can be obtained. In addition, according to the present invention, the covering member, the base member, and the body member constituting the package can be made of the same materials, so that each of them has the same thermal expansion coefficient, thereby realizing a quartz crystal device and a package that is excellent in thermal stability.

According to the present invention, by means of an ion-milling method, a sandblasting method, or a chemical etching method using chemical reaction by hydrofluoric acid or the like, the quartz plate having the desired resonance characteristics or filter characteristics can be thinly polished, thereby realizing a quartz device having an extremely high Q value.

According to the present invention, the electrode on one face of the quartz plate can be led to the opposite face via the through-hole filled with a conductive material, so that the package can be more readily mounted on a circuit board.

According to the present invention, the through-hole filled with the conductive material can be formed in the supported quartz plate, and a conductive bump can be formed so as to extend from the through-hole. Thus, the conductive bump can be pressed onto an electrode portion of the quartz plate where the electrode is formed so as to lead the electrode to the outside, thereby realizing a quartz filter capable of performing an excellent hermetic packaging.

In the case where a parent material is coated with an ionic material, the material for the parent material can arbitrarily be determined considering the processability and the production cost, etc. Therefore, the package can readily be realized with a desired shape, at a low cost.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A piezoelectric device comprising:

a piezoelectric plate provided with at least one electrode at almost a central portion of each face, a first plate made of an ionic material having a recessed portion to cover said at least one electrode at one face to face said piezoelectric plate, and a second plate made of an ionic material having a recessed portion to cover said at least one electrode at one face to face said piezoelectric plate, wherein each of said at least one electrodes is formed, and then packaged by direct bonding said piezoelectric plate with said first plate and said second plate so as to be sandwiched therebetween with no intervening adhesive or structure and subsequently annealing the device at a temperature where said piezoelectric plate is crystallographically stable.

2. A piezoelectric device according to claim 1, wherein said piezoelectric plate, said first plate, and said second plate are all made of quartz.

3. A piezoelectric device comprising:

a piezoelectric plate provided with at least one electrode at almost a central portion corresponding to a thinner portion of each face, one face thereof having a recessed portion, the other face thereof being made flat, a first plate made of an ionic material having a recessed portion to cover said at least one electrode at one face to face said flat face of said piezoelectric plate, and a second plate made of an ionic material having a flat face to face said face having said recessed portion of said piezoelectric plate, wherein each of said at least one electrodes is formed, and then packaged by direct bonding said piezoelectric plate with said first plate and said second plate so as to be sandwiched therebetween with no intervening adhesive or structure and subsequently annealing the device at a temperature where said piezoelectric plate is crystallographically stable.

4. A piezoelectric device according to claim 3, wherein said piezoelectric plate, said first plate, and said second plate are all made of quartz.

5. A piezoelectric device comprising:

a piezoelectric plate provided with at least one electrode at almost a central portion corresponding to a thinner portion of each face having a recessed portion, a first plate made of an ionic material having a flat face to face said piezoelectric plate, and a second plate made of an ionic material having a flat face to face said piezoelectric plate, wherein each of said at least one electrodes is formed, and then packaged by direct bonding said piezoelectric plate with said first plate and said second plate so as to be sandwiched therebetween with no intervening adhesive or structure and subsequently annealing the device at a temperature where said piezoelectric plate is crystallographically stable.

6. A piezoelectric device according to claim 5, wherein said piezoelectric plate, said first plate, and said second plate are all made of quartz.

7. A method of making a piezoelectric device comprising the steps of:

providing a piezoelectric plate;

forming at least one electrode at almost a central portion of each face of the piezoelectric plate;

providing a first plate made of an ionic material having a recessed portion to cover said at least one electrode at one face to face said piezoelectric plate;

providing a second plate made of an ionic material having a recessed portion to cover said at least one electrode at one face to face said piezoelectric plate;

packaging each of said at least one electrodes by direct bonding said piezoelectric plate with said first plate and said second plate so as to be sandwiched therebetween with no intervening adhesive or structure; and, annealing the device at a temperature where said piezoelectric plate is crystallographically stable.

8. A piezoelectric device made in accordance with the method of claim 7.

9. The method of claim 7 wherein the direct bonding comprises the steps of:

cleaning a face of the ionic material of the first plate thereby forming a hydroxyl group and several layers of water molecules around the hydroxyl group on the face;

cleaning a face of the ionic material of the second plate thereby forming a hydroxyl group and several layers of water molecules around the hydroxyl group on the face; and placing the faces of the two plates together.

10. A piezoelectric device made in accordance with the method of claim 9.

* * * * *